United States Patent
Fujimura et al.

(10) Patent No.: US 7,507,678 B2
(45) Date of Patent: Mar. 24, 2009

(54) METHOD AND APPARATUS FOR FORMING OXYNITRIDE FILM AND NITRIDE FILM, OXYNITRIDE FILM, NITRIDE FILM, AND SUBSTRATE

(75) Inventors: Norifumi Fujimura, Osaka (JP); Ryoma Hayakawa, Osaka (JP); Hiroya Kitahata, Chiba (JP); Tsuyoshi Uehara, Ibaraki (JP); Takuya Yara, Osaka (JP)

(73) Assignee: Sekesui Chemical Co., Ltd., Osaka (JP)

( * ) Notice: Subject to any disclaimer, the term of this patent is extended or adjusted under 35 U.S.C. 154(b) by 0 days.

(21) Appl. No.: 10/594,252

(22) PCT Filed: Mar. 25, 2005

(86) PCT No.: PCT/JP2005/006412

§ 371 (c)(1),
(2), (4) Date: Sep. 26, 2006

(87) PCT Pub. No.: WO2005/093810

PCT Pub. Date: Oct. 6, 2005

(65) Prior Publication Data

US 2007/0190801 A1    Aug. 16, 2007

(30) Foreign Application Priority Data

Mar. 26, 2004  (JP) .................... 2004-093870

(51) Int. Cl.
  *H01L 21/31* (2006.01)
(52) U.S. Cl. ............... 438/786; 257/E21.269; 257/E21.293
(58) Field of Classification Search .................. 438/786
  See application file for complete search history.

(56) References Cited

U.S. PATENT DOCUMENTS 4,671,813 A * 6/1987 Yoshino .................. 62/643
2002/0025691 A1   2/2002 Ohmi et al.

FOREIGN PATENT DOCUMENTS

| JP | 2002-100578 A | 4/2002 |
| JP | 2002-155370 A | 5/2002 |
| JP | 2002-324795 A | 11/2002 |
| JP | 2003-203800 A | 7/2003 |
| JP | 2003-309117 A | 10/2003 |
| JP | 2005-026358 A | 1/2005 |

OTHER PUBLICATIONS

Nitride Film Formed With Reduced Defects by Atmospheric Pressure Plasma: Osaka Prefecture University and Sekisui Chemical; Dec. 20, 2004.

* cited by examiner

*Primary Examiner*—Alexander G Ghyka
(74) *Attorney, Agent, or Firm*—Sughrue Mion, PLLC

(57) ABSTRACT

Uniform oxynitride and nitride films can be formed by low-temperature and high-speed nitriding reaction not dependent on the nitriding time or nitriding temperature. A solid dielectric is provided on at least one of opposed surfaces of a pair of electrodes opposed to each other under a pressure of 300 (Torr) or higher, a nitrogen gas containing an oxide equal to or lower than 0.2% is introduced into a space between the pair of opposed electrodes, an electric field is applied to the nitrogen gas, and the resulting $N_2$ ($2^{nd}$ p.s.) or $N_2$ (H.I.R) active species is brought into contact with an object to be processed to form an oxynitride film/nitride film on a surface of the object to be processed.

12 Claims, 28 Drawing Sheets

A.N.Wright and C.A.Winkler, Active nitrogen
(Academic, New York, 1968)

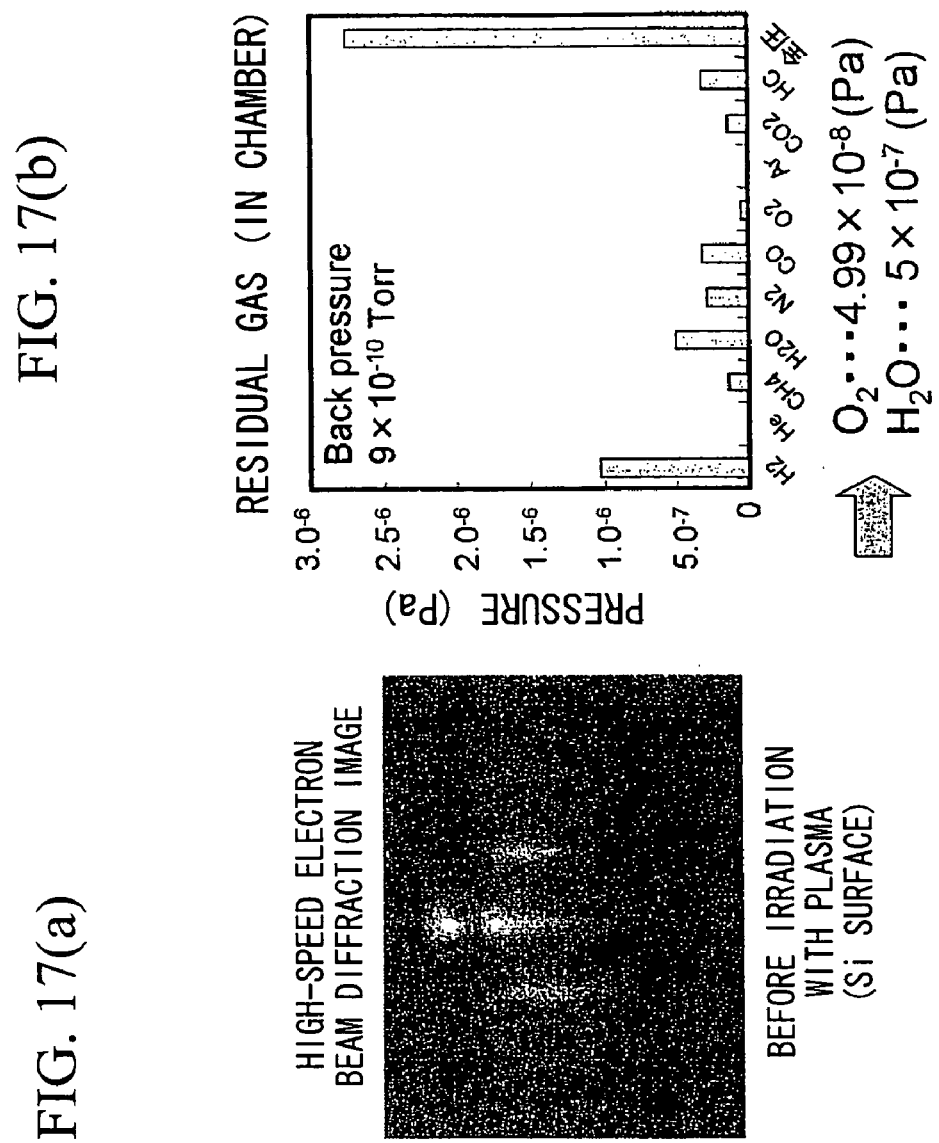

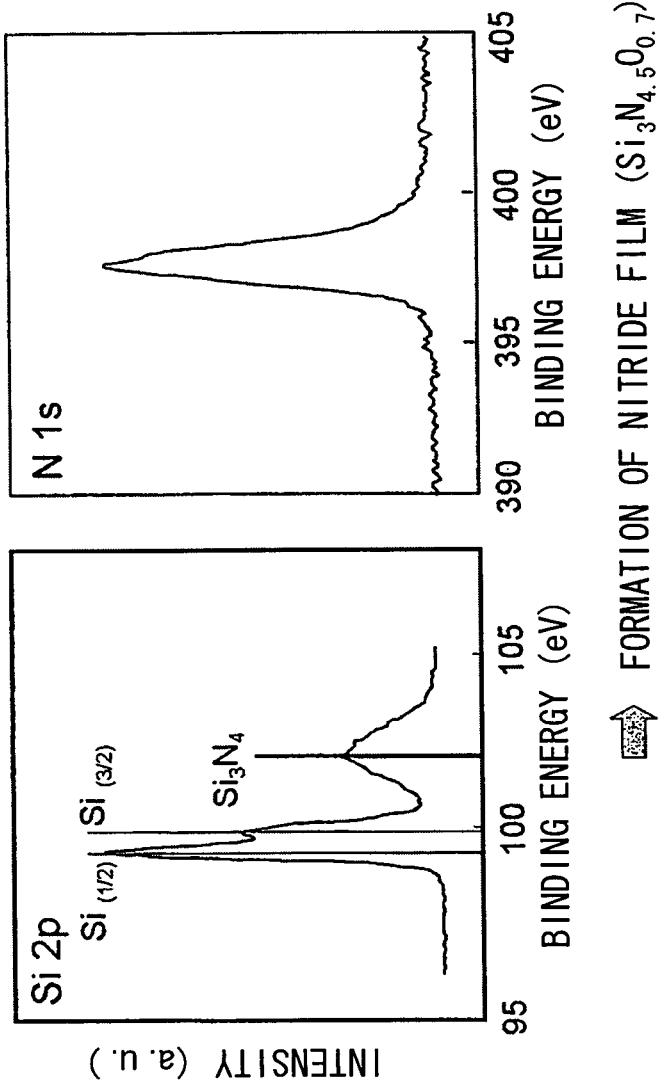

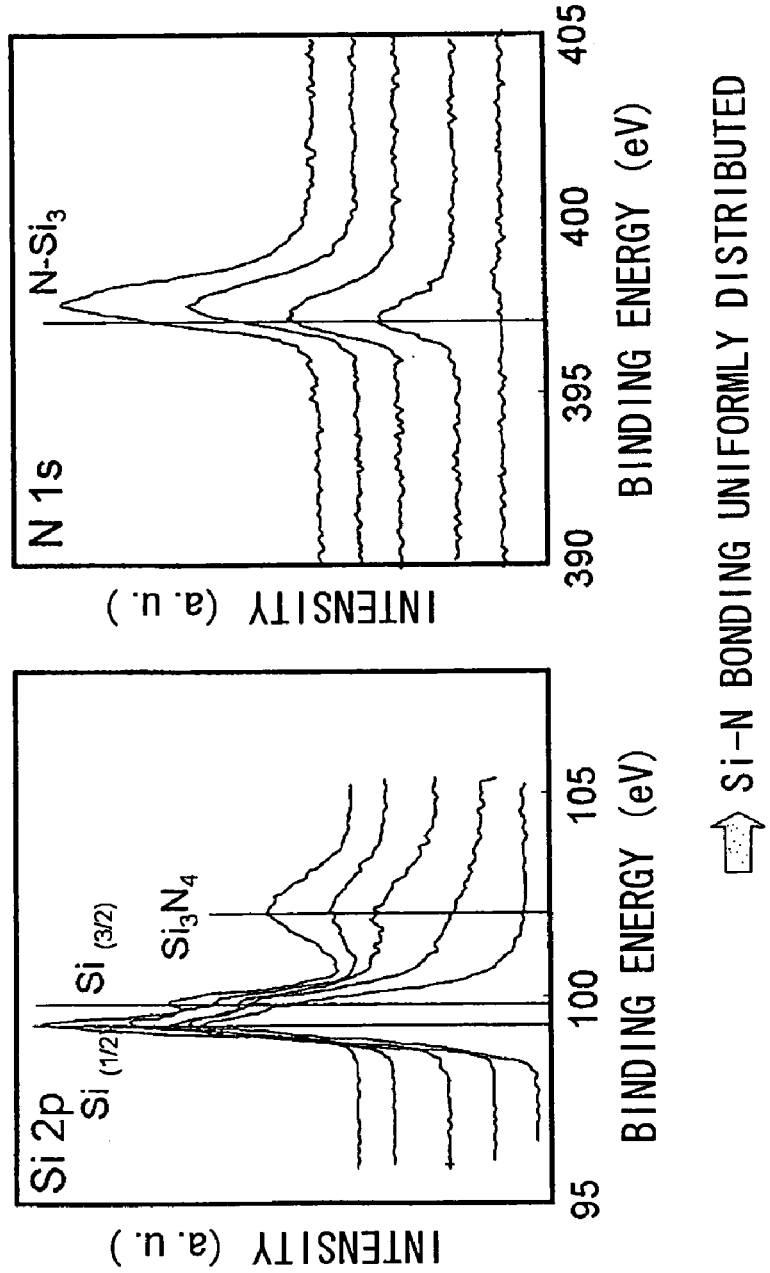

ATMOSPHERIC PRESSURE PLASMA (AP plasma): PRESSURE : 500 Torr
NITRIDING TIME : 10min RF PLASMA (RF plasma): PRESSURE : 1×10⁻⁵ Torr
NITRIDING TIME : 60min

FIG. 31

| | |
|---|---|
| SUBSTRATE | Si (111) |
| NITRIDING TEMPERATURE | ROOM TEMPERATURE ~500°C |

RF PLASMA

PRESSURE          $1.0 \times 10^{-5}$ Torr

NITRIDING TIME    10 min. ~ 180 min.

ATMOSPHERIC PRESSURE PLASMA

PRESSURE          500 Torr

NITRIDING TIME    10 sec. ~ 15 min.

Ref: K. Muraoka et al. J. Appl. Phys, 94, 2038

US 7,507,678 B2

METHOD AND APPARATUS FOR FORMING OXYNITRIDE FILM AND NITRIDE FILM, OXYNITRIDE FILM, NITRIDE FILM, AND SUBSTRATE

TECHNICAL FIELD

The present invention relates to a method for forming an oxynitride film or a nitride film under nearly atmospheric pressure, an apparatus for forming the same, an oxynitride film and a nitride film formed by using the formation method and the formation apparatus, and to a substrate on which the oxynitride film or the nitride film is formed.

BACKGROUND ART

A semiconductor device, e.g., a transistor is ordinarily constituted of a gate electrode, a gate insulating film, a source electrode, a drain electrode, a passivation film (protective film) and so on formed on a substrate. As the substrate (object to be processed), a silicon wafer, a glass substrate or the like is used. As the electrodes, a metal such as Al, a polysilicon or the like is used. As an interlayer insulating member comprising the passivation film, silicon nitride, silicon oxide, silicon carbide or the like is used.

Silicon oxide film is ordinarily used as the above-mentioned gate insulating film. With the reduction in device size and with the improvements in characteristics achieved by increasing the operating speed for example, studies have been made of using as the gate insulating film a silicon nitride film whose dielectric constant (7.9) is larger than that (3.9) of silicon oxide film, hafiiia ($HfO_2$), silicate and aluminate of this (a mixture of Hf (hafnium)-Si—O and Hf—Al—O) and materials obtained by doping these with nitrogen (varying in dielectric constant depending on the composition).

Patent Document 1 discloses a thin film forming apparatus in which a plasma CVD device in line form formed of a plasma generating section in line form and an introduction section through which a reaction gas is introduced, an annealing section in which a thin film formed by this plasma CVD is annealed with light in line form and a plasma processing device in line form for processing the surface of the annealed thin film with plasma are disposed in series, and which is capable of eliminating impurities in the amorphous silicon surface and obtaining a good device with improved reproducibility.

Silicon nitride film formed by an ordinary film formation method such as a plasma CVD or CVD, however, has many electrons or hole traps existing therein and is, therefore, disadvantageously low in reliability. There is also a problem that, while there is a need to form a uniform silicon nitride film having a thickness of several nanometers with stability, it is difficult to form a film uniform in thickness with satisfactory reproducibility.

The applicant of the present invention already filed a patent application of a silicon wafer nitriding method and apparatus for forming a silicon nitride film on a silicon wafer surface so that electrons or hole traps in the film are reduced (see Patent Document 2).

The following are examples of documents relating to the above-described arts.

1) JP Patent Publication (Kokai) No. 2002-100578A
2) JP Patent Publication (Kokai) No. 2002-324795A

DISCLOSURE OF THE INVENTION

The invention described in the above Patent Document 2 makes it possible to form a silicon nitride film on a surface of a silicon wafer by bringing plasma of a processing gas into contact with the silicon wafer under a nearly atmospheric pressure, and can provide a film forming process as a more efficient system under a low temperature condition.

However, forming of nitride film and oxynitride film can be widely applied to high-dielectric insulating materials, nitride semiconductors, etc., as well as to silicon wafers. The inventors of the present invention have eagerly studied to analyze a most suitable method for forming a nitride film and oxynitride film.

In view of the above-described problems, an object of the present invention is to provide a method and apparatus for forming oxynitride or nitride film which enable a uniform oxynitride or nitride film to be formed under atmospheric pressure without a nitriding time or temperature dependence of nitriding reaction, and which are capable of high-speed nitriding at a low temperature.

Another object of the present invention is to provide an oxynitride film and a nitride film manufactured by a method of forming oxynitride or nitride film which enables an oxynitride or nitride film to be formed under atmospheric pressure, and which is capable of high-speed nitriding at a low temperature and has excellent device characteristics, and to provide a substrate on which the oxynitride or nitride film is formed.

The method for forming an oxynitride film and nitride film according to the present invention is characterized by comprising providing a solid dielectric on at least one of opposed surfaces of a pair of electrodes opposed to each other under a nearly atmospheric pressure of 300 Torr or higher, preferably under a pressure not exceeding 1000 Torr, more preferably, from the viewpoint of facility of discharge, under a pressure of 500 to 800 Torr, introducing a nitrogen gas into a space between the pair of opposed electrodes, applying an electric field to the nitrogen gas, and bringing the resulting plasma into contact with an object to be processed to form an oxynitride film or nitride film on a surface of the object to be processed.

The method for forming an oxynitride film and a nitride film according to the present invention is characterized by comprising providing a solid dielectric on at least one of opposed surfaces of a pair of electrodes opposed to each other under a pressure at which an $N_2$ (H.I.R) and/or $N_2$ ($2^{nd}$ p.s.) active species appears dominantly as active nitrogen species observed by optical emission spectroscopy, introducing a nitrogen gas into a space between the pair of opposed electrodes, applying an electric field to the nitrogen gas, and bringing the resulting plasma into contact with an object to be processed to form an oxynitride film or nitride film on a surface of the object to be processed.

In a more preferable specific aspect, an oxynitride film having improved device characteristics can be formed if the nitrogen gas contains oxygen or an oxide at equal to or lower than 0.2% and higher than 1 ppm. The nitrogen gas containing an oxide at equal to or lower than 0.2% and higher than 1 ppm is a general-purpose high-purity nitrogen gas not requiring rare gas mixing, component control and the like. Therefore the nitrogen gas can be easily used. More preferably, the nitrogen gas contains an oxide at equal to or lower than 0.1% and higher than 1 ppm.

In a more preferable specific aspect, the above-described nitrogen gas is a high-purity nitrogen gas containing oxygen or an oxide at equal to or lower than 1 ppm when a nitride film is formed. Further, if the content of oxygen or an oxide in the nitrogen gas is 1 ppb or lower, an excellent nitride film can be formed. The oxide is, for example, NOx, $CO_2$, or $H_2O$.

In a more preferable specific aspect, the above-described plasma is $N_2$ ($2^{nd}$ p.s.) and/or $N_2$ (H.I.R) active species as active nitrogen species observed by optical emission spectroscopy. Alternatively, only neutral active species is present in the above-described plasma as the active nitrogen species observed by emission spectroscopy. An active nitrogen species which does not cause plasma damage under nearly atmospheric pressure is the $N_2$ ($2_{nd}$ p.s.) or $N_2$ (H.I.R) active species. If film forming is performed under a pressure at which these active nitrogen species are dominant, an excellent nitride film uniform in binding can be formed at a high film forming speed at low temperatures including room temperature.

In a more preferable specific aspect, the nearly atmospheric pressure is a pressure equal to or higher than 300 Torr at which the $N_2$ (H.I.R) or $N_2$ ($2^{nd}$ p.s.) active species appears dominantly as the active nitrogen species observed by optical emission spectroscopy, and at which the $N_2$ ($2^{nd}$ p.s.) active species appears more frequently than $N_2$ ($1^{st}$ p.s.). If film forming is performed under a pressure at which the $N_2$ ($2^{nd}$ p.s.) or $N_2$ (H.I.R) active species is dominant, an excellent nitride film uniform in binding can be formed at a high film forming speed at low temperatures including room temperature.

Also, if film forming is performed under the above-described pressure in the case of forming oxynitride film or nitride film by using the method for forming an oxynitride film and a nitride film of the present invention, an oxynitride film or nitride film having an improved dielectric characteristic and a markedly excellent leak current characteristic can be formed at a high film forming speed at low temperatures including room temperature.

Preferably, the above-mentioned solid dielectric is a dielectric formed of, for example, a metal oxide or a metal nitride such as a sintered ceramic. More preferably, the solid dielectric is a dielectric containing substantially no oxide, e.g., a dielectric containing one of aluminum nitride AlN, silicon nitride $Si_3N_4$ and boron nitride BN. If a solid dielectric formed of such a nitride containing substantially no oxide is used, a change in the amount of any oxide contained in the nitrogen gas or added, due to contamination by an oxide from the solid dielectric, can be prevented and the amount of an oxide participating in the formation of an oxynitride film or a nitride film can be easily controlled by changing the amount of the oxide contained in the nitrogen gas or added.

The plasma is, more preferably, a remote type to be brought into contact with the object to be processed in a diffusion region outside the discharge space between the opposed electrodes, because it has been confirmed that the $N_2$ (H.I.R) and $N_2$ ($2^{nd}$ p.s.) active species appear dominantly in the diffusion region. A direct type is also possible such that the plasma generated in the discharge space between the opposed electrodes is directly brought into contact with the object to be processed. The direct type ensures that the $N_2$ ($2^{nd}$ p.s.) active species appears dominantly, although the $N_2$ (H.I.R) is not recognized.

In a more preferable specific aspect, the above-described active nitrogen species include at least one of $N_2$ ($2^{nd}$ p.s.) and $N_2$ (H.I.R).

It is sufficient to set the surface temperature of the object to be processed to 50° C. or higher, preferably 100° C. or higher. There is no need for heating a particularly high temperature (e.g., 1000° C. or higher).

According to the present invention, an apparatus for forming an oxynitride film or nitride film includes a pair of opposed electrodes with a solid dielectric being provided on at least one of opposed surfaces; a mechanism for introducing a nitrogen gas containing oxygen or an oxide at equal to or lower than 0.2% into a space between the pair of opposed electrodes; a mechanism for applying an electric field (which may be an alternating pulse electrode or a sine-wave electric field) to the space between the electrodes; and a mechanism for bringing plasma obtained by the electric field into contact with an object to be processed.

In a more preferable specific aspect, the above-mentioned nitrogen gas is a high-purity nitrogen gas containing oxygen or an oxide at equal to or lower than 1 ppm when a nitride film is formed. Also, the nitrogen gas is a nitrogen gas containing oxygen or an oxide at equal to or lower than 0.2% and higher than 1 ppm when an oxynitride film is formed.

In a more preferable specific aspect, the above-mentioned plasma is a plasma in which $N_2$ ($2^{nd}$ p.s.) and/or $N_2$ (H.I.R) active species appear dominantly as active nitrogen species observed by optical emission spectroscopy.

Preferably, the nearly atmospheric pressure is 300 Torr or higher.

The mechanism for bringing the plasma into contact with the object to be processed is a remote-type mechanism which brings the plasma generated in a discharge space between the opposed electrodes into contact with the object to be processed in a diffusion region outside the discharge space between the opposed electrodes.

Also, the present invention provides an oxynitride film and a nitride film formed by the above-described method or apparatus forming oxynitride film and nitride film, and a substrate on which the oxynitride film or the nitride film is formed.

According to the present invention, a uniform nitride film capable of low-temperature high-speed nitriding can be formed under a nearly atmospheric pressure by nitriding reaction not dependent on the nitriding time or the nitriding temperature.

Also, an oxynitride film capable of low-temperature high-speed nitriding and having improved dielectric characteristics and leak current characteristics can be formed under a nearly atmospheric pressure.

Also, optimum film forming conditions can be realized by observing generated plasma.

BRIEF DESCRIPTION OF THE DRAWINGS

FIG. 17 is a diagram showing conditions for nitriding of a Si substrate;

FIG. 18 is a diagram showing the results of X-ray photoelectric spectroscopy measurement on a nitride film formed by the apparatus and method in this example;

FIG. 19 is a diagram showing the state of binding in the depth direction of nitride film formed by the apparatus and method in this example;

FIG. 31 is a comparison table in a case where oxynitride films are formed by the RF plasma nitride film forming apparatus and the nitride film forming apparatus of the present invention;

BEST MODE FOR CARRYING OUT THE INVENTION

[Summary]

The present invention provides a method of analyzing nitride plasma generated by an atmospheric-pressure plasma method and provides a nitride film formation method and an oxynitride film formation method on the basis of findings obtained by the nitride plasma analysis method. Description will be made of them by following the sequence of items shown below.
1. Method of analyzing nitrogen plasma
   Optical emission spectroscopy (OES)
      Evaluation of active nitrogen species
2. Method of nitriding with nitrogen plasma
   Method for forming a nitride film
      Evaluation of structure
      Kinetics of nitriding (nitriding time, temperature)
   Method for forming an oxynitride film
      Evaluation of structure, evaluation of dielectric characteristics
      Mechanism of nitriding of Si under high pressure The present invention uses a nitriding processing method in which an oxynitride film or a nitride film is formed by a nitrogen plasma method under a condition of nearly atmospheric pressure, as does the invention in the earlier application (see Patent Document 2). The present invention therefore takes the advantages of film forming under atmospheric pressure, as described below. Description of the present invention will be briefly made in relation to the above-described art in the earlier application.

Figure 1:
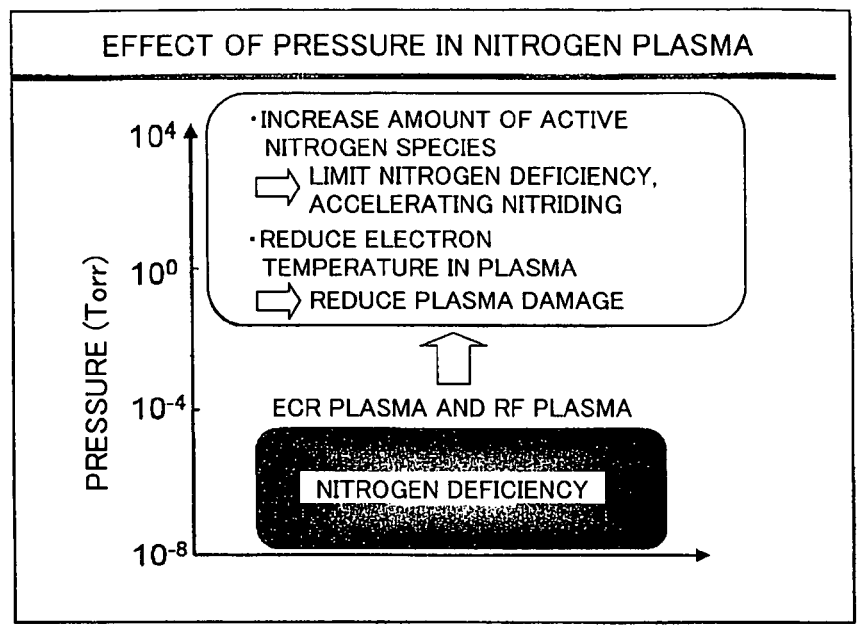
FIG. 1 is a diagram showing the effect of pressure in nitrogen plasma.

FIG. 1 is a diagram showing the effect of pressure in nitrogen plasma.

In film forming by an ECR plasma method and an RF plasma method performed at a low pressure of $10^{-4}$ to $10^{-8}$ Torr, nitrogen cannot easily be introduced because of the low pressure, so that a nitrogen deficiency can occur easily, as shown in FIG. 1. In contrast, the nitrogen plasma method of the present invention in which film forming is performed at an ordinary nearly atmospheric pressure ensures limitation on the amount of nitrogen deficiency and promotion of nitriding by increasing the amount of an active nitrogen species. The method of the present invention also reduces ion species in plasma and therefore reduces damage due to plasma.

Figure 2:
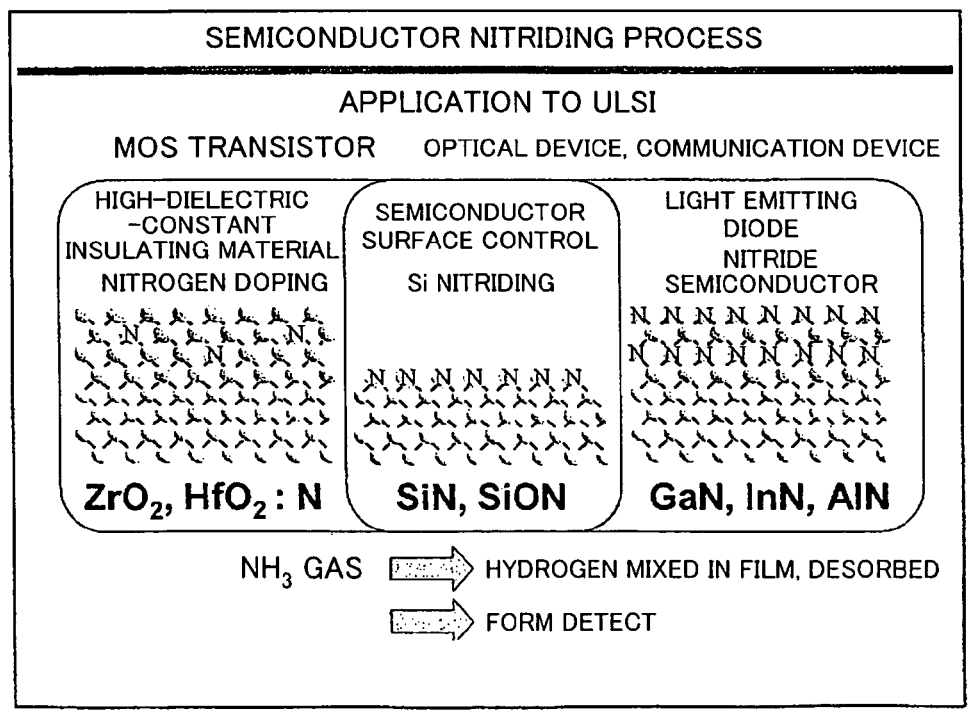
FIG. 2 is a diagram showing an example of fields of application of a nitride film formation method and an oxynitride film formation method of the present invention.

FIG. 2 is a diagram showing an example of fields of application of the nitride film formation method and the oxynitride film formation method of the present invention.

In a central portion of FIG. 2, Silicon nitridation (SiN, SiON) disclosed in the earlier invention application is schematically shown. The present invention includes this Silicon nitridation (SiN, SiON) technique and constructs a nitriding process using nitrogen gas on the basis of the nitrogen plasma analysis method. The nitride film formation method and the oxynitride film formation method of the present invention ensures that the nitriding process can be strictly controlled. Therefore they can also be applied, for example, to doping an oxide (e.g., $ZrO_2$, $HfO_2$) to a high-dielectric-constant insulating material for a MOS transistor with a small amount of nitrogen N, as shown in a left block in FIG. 2, and, for example, to forming a nitride semiconductor (e.g., GaN, InN, AlN) for a light emitting diode, as shown in a right block in FIG. 2.

[Method of analyzing nitride plasma]

The present invention is a method in which plasma of nitrogen gas obtained under a nearly atmospheric pressure by an atmospheric pressure plasma method of placing a solid dielectric on at least one of opposed surfaces of a pair of electrodes opposed to each other, introducing nitrogen gas into the space between the pair of opposed electrodes, and applying an electric field in pulse form between the electrodes is brought into contact with an object to be nitrided to form a nitride film on the object or dope the object with nitride.

Examples of a means for bringing plasma into contact with a silicon wafer include (1) a direct-type means of placing the object to be nitrided, which is an object to be processed, in a discharge space for plasma generated between the opposed electrodes, and bringing the plasma into contact with the object to be nitrided, and (2) a remote-type means of bringing plasma generated between the opposed electrodes into contact with the object to be processed in a diffusion region outside the discharge space.

Figure 3:
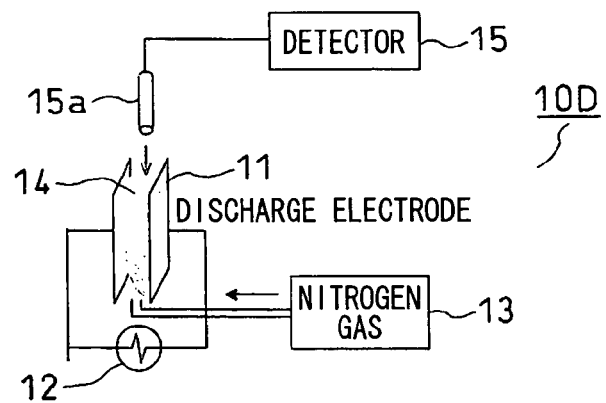
FIG. 3 is a diagram for explaining a nitrogen plasma optical emission spectroscopy method using a direct plasma technique.

FIG. 3 is a diagram for explaining a nitrogen plasma optical emission spectroscopy method using a direct plasma technique for directly observing a generated plasma portion.

Referring to FIG. 3, a nitrogen plasma optical emission spectroscopy apparatus 10D has a pair of discharge electrodes 11 having opposed surfaces on which a solid dielectric is provided, a power supply 12 for applying an alternating electric field (e.g., an electric field in pulse form) between the opposed discharge electrodes 11, a nitrogen gas supply unit 13 for supplying nitrogen gas, and a spectrum detector 15 which has a probe 15a disposed so as to face plasma 14 generated between the discharge electrodes 11 by application of the electric field in pulse form, and which detects the emission intensity and wavelength of light emitted from nitrogen gas in plasma form. The nitrogen plasma optical emission spectroscopy apparatus 10D is installed in a chamber such as to be capable of performing nitrogen plasma emission spectroscopy under an arbitrary pressure by changing pressure conditions.

Figure 4:
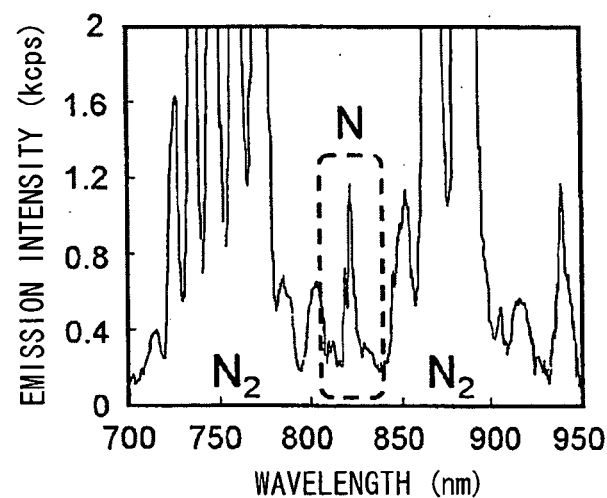
FIG. 4 is a diagram showing the results of spectral analysis on nitrogen plasma emission observed as shown in FIG. 3.

FIG. 4 is a diagram showing the results of spectral analysis on emission from nitrogen plasma generated under a pressure of 45 Torr by using the above-described nitrogen plasma optical emission spectroscopy apparatus 10D and observed by the direct plasma technique. A portion of FIG. 4 corresponding to wavelengths from 700 to 950 (nm) is shown in an enlarged state. The ordinate represents the emission intensity (kcps) and the abscissa represents the wavelength (nm). The appearance of an excited species of nitrogen N in atom form was confirmed at a comparatively high degree of vacuum under a pressure of 45 Torr, that is, in nitrogen plasma generated in a low-pressure region, as shown in a portion of FIG. 4 surrounded by the broken line.

Figure 5:
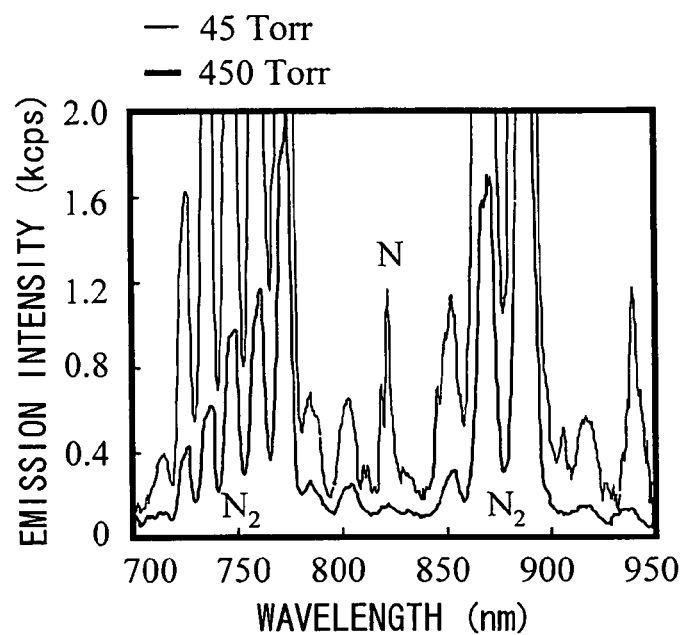
FIG. 5 is a diagram showing in a superposed state the results of spectral analysis on luminescence from nitrogen plasma generated at a pressure of 45 Torr and on emission from nitrogen plasma generated at a pressure of 450 Torr, emission being observed by the direct plasma technique.

FIG. 5 is a diagram showing a wavelength-700-950 (nm)-portion of the results of spectral analysis on emission from nitrogen plasma which was generated at a pressure of 450 Torr under the same conditions except that the pressure was changed, and which was observed by the direct plasma technique. In FIG. 5, the portion of the results of analysis is shown in a state of being superposed on the results of spectral analysis shown in FIG. 4 on emission from nitrogen plasma generated under a pressure of 45 Torr.

It was confirmed that, as shown in FIG. 5, a peak of emission of light from nitrogen in atom form appearing at a wavelength about 820 nm in nitride plasma generated at a pressure of 45 Torr did not appear in the case of nitrogen plasma generated at a pressure of 450 Torr.

Figure 6:
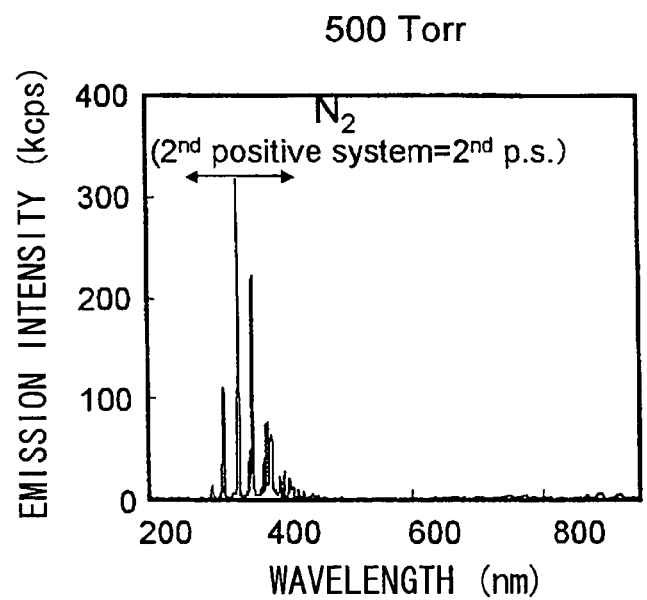
FIG. 6 is a diagram showing the results of spectral analysis on nitrogen plasma emission observed as shown in FIG. 3.

FIG. 6 is a diagram showing the results of spectral analysis on emission from nitrogen plasma generated at a pressure of 500 Torr by using the above-described nitrogen plasma optical emission spectroscopy apparatus 10D applying a voltage of 3.3 kV to the discharge electrodes 11, and observed by the direct plasma technique.

In FIG. 6, the ordinate represents the emission intensity (kcps) and the abscissa represents the wavelength (nm) with respect to observation at a pressure of 500 Torr. At wavelengths about 300 to 400 nm in the observation results, nitrogen gas $N_2$ ($2^{nd}$ p.s.) in plasma form called an $N_2$ second positive system (2nd positive system, hereinafter referred to as "$2^{nd}$ p.s.") is dominant. This $N_2$ ($2^{nd}$ p.s.) is an active nitrogen species which increases under nearly atmospheric pressure as an atmospheric nonequilibrium plasma in $N_2$ plasma as well as the $N_2$ Herman's infra-red system (hereinafter referred to as H.I.R.) described below.

Figure 7:
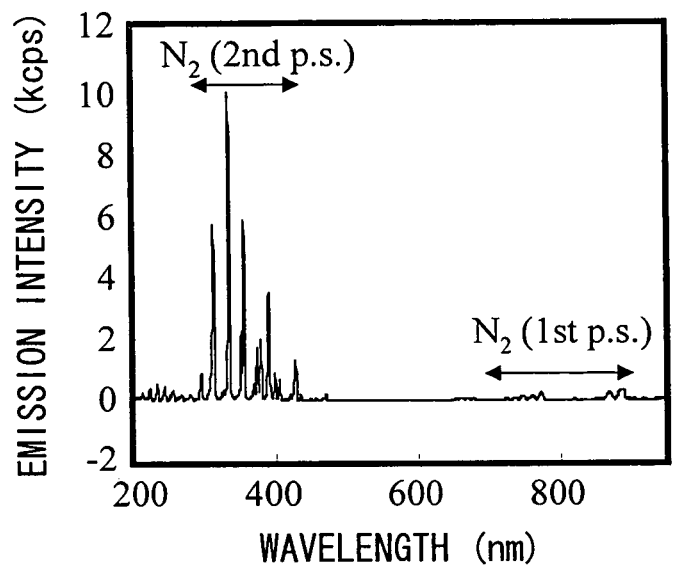
FIG. 7 is a diagram showing the results of spectral analysis on nitrogen plasma emission shown in FIG. 4 by including a wavelength region portion other than the wavelength region shown in FIG. 4.

FIG. 7 is a diagram showing the results of spectral analysis on emission from nitrogen plasma generated at a pressure of 45 Torr as shown in FIG. 4 and observed by the direct plasma technique, by including a wavelength region portion other than the wavelength region shown in FIG. 4.

It can be confirmed that, as shown in FIG. 7, the intensity itself of light emitted from nitrogen gas $N_2$ ($2^{nd}$ p.s.) in plasma form with wavelengths about 300 to 400 nm in the case where the pressure was 45 Torr was reduced by orders of magnitude relative to the intensity of light emitted from nitrogen gas $N_2$ ($2^{nd}$ p.s.) in plasma form with wavelengths about 300 to 400 nm in the results of spectral analysis shown in FIG. 6 on emission from nitrogen plasma at a pressure of 500 Torr.

It can also be confirmed from FIG. 7 that $N_2$ ($1^{nd}$ p.s.) described below appears at wavelengths about 600 to 900 nm.

A feature of the present invention resides in the method of considering an active nitride species in plasma and forming a nitride film and an oxynitride film under a condition where $N_2$ (H.I.R) and/or $N_2$ ($2^{nd}$ p.s.) in particular is dominant. Comparison between active nitrogen species on the basis of nitrogen plasma optical emission spectroscopy will therefore be described below in detail with reference to FIG. 12.

Figure 8:
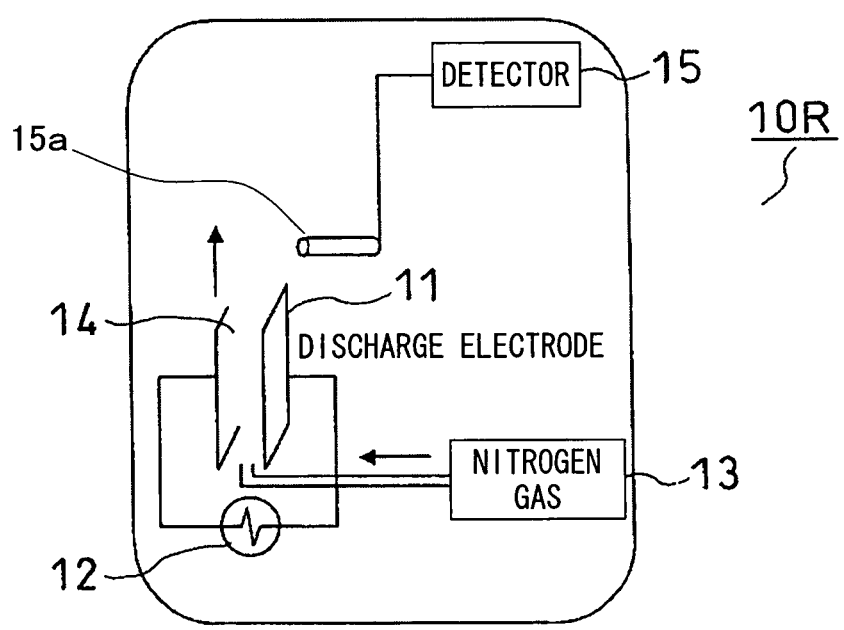
FIG. 8 is a diagram for explaining a remote-type nitrogen optical plasma emission spectroscopy method.

FIG. 8 is a diagram for explaining a nitrogen plasma optical emission spectroscopy method using a remote plasma technique for observing blown-off nitrogen plasma itself without directly observing a generated plasma portion (inside the electrodes).

The same apparatus components as those in the case of the nitrogen plasma optical emission spectroscopy method using the direct plasma technique and described above with reference to FIG. 3 are indicated by the same reference characters.

Referring to FIG. 8, a nitrogen plasma optical emission spectroscopy apparatus 10R has a pair of discharge electrodes 11 having opposed surfaces on which a solid dielectric is provided, a power supply 12 for applying an alternating electric field (e.g., an electric field in pulse form) between the opposed discharge electrodes 11, a nitrogen gas supply unit 13 for supplying nitrogen gas, and a spectrum detector 15 which has a probe 15a disposed so as to face an opening through which plasma 14 generated between the discharge electrodes 11 is blown off, and which detects the intensity and wavelength of light emitted from nitrogen gas in plasma form. The nitrogen plasma optical emission spectroscopy apparatus 10R is installed in a chamber such as to be capable of performing nitrogen plasma optical emission spectroscopy under an arbitrary pressure by changing pressure conditions.

Figure 9:
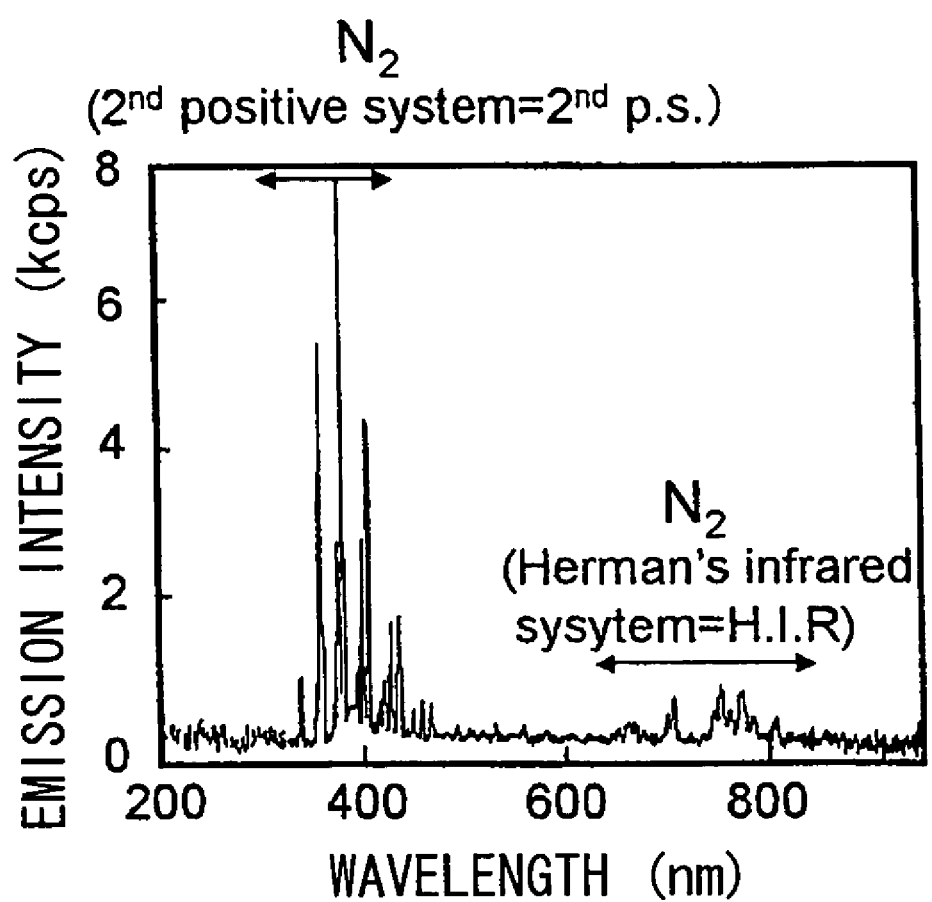
FIG. 9 is a diagram showing the results of spectral analysis on nitrogen plasma emission observed as shown in FIG. 6.

FIG. 9 is a diagram showing the results of spectral analysis on emission from nitrogen plasma generated by using the above-described nitrogen plasma optical emission spectroscopy apparatus 10R under conditions: a pressure of 500 Torr, a discharge electrode 11 application voltage of 3.3 kV, and a nitrogen gas flow rate of 5 liters/min., and observed by the remote plasma technique. The ordinate represents the emission intensity (kcps) and the abscissa represents the wavelength (nm).

As shown in FIG. 9, $N_2$ ($2^{nd}$ p.s.), which is a neutral active species, is dominant at a wavelength of about 400 nm in the observation results, and $N_2$ (H.I.R), which is a neutral active species, is dominant at wavelengths about 600 to 900 nm in the observation results. Description will also be made in detail of $N_2$ ($2^{nd}$ p.s.) and $N_2$ (H.I.R) with reference to FIG. 12. The reason for the fact that the neutral active species $N_2$ ($2^{nd}$ p.s.) and $N_2$ (H.I.R) are dominant only in nitrogen plasma blown off the region inside the electrodes as observed by the remote plasma technique is not clear. However, it is thought that the necessary active nitrogen species remains at a certain distance as a result of the process in which various kinds of plasma excited in the discharge region inside the electrodes as observed by the direct plasma technique are diffused by being blown off the region inside the electrodes, as observed by the remote plasma technique, while repeating impinging against each other.

The reason for the fact that the value of the emission intensity (kcps) on the ordinate in the results of spectral analysis shown in FIG. 9 on nitrogen plasma emission observed by the remote plasma technique is lower than the value of the emission intensity (kcps) on the ordinate in the results of spectral analysis shown in FIG. 6 on nitrogen plasma emission observed by the direct plasma technique is based on the difference between the remote plasma technique and the direct plasma technique. The difference between the values does not indicate a reduction in the amount of the neutral active species $N_2$ ($2^{nd}$ p.s.) itself.

Figure 10A:
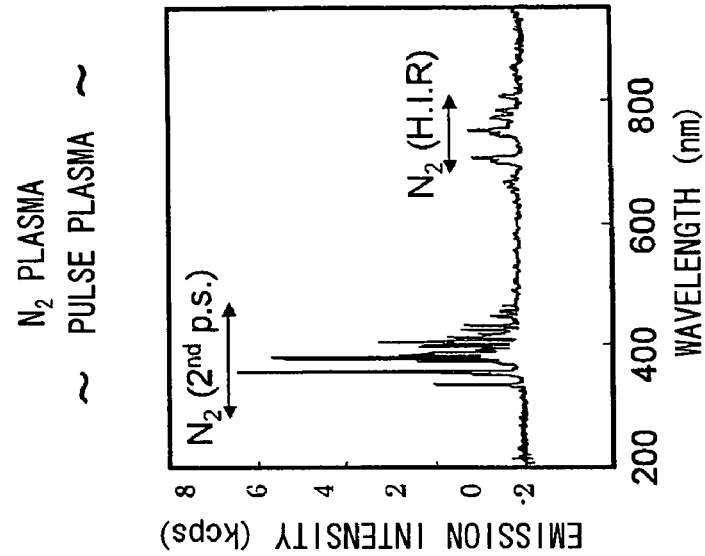
FIG. 10 is a diagram showing the results of spectral analysis on $N_2$ plasma emission and $He/N_2$ plasma emission in comparison with each other.
Figure 10B:
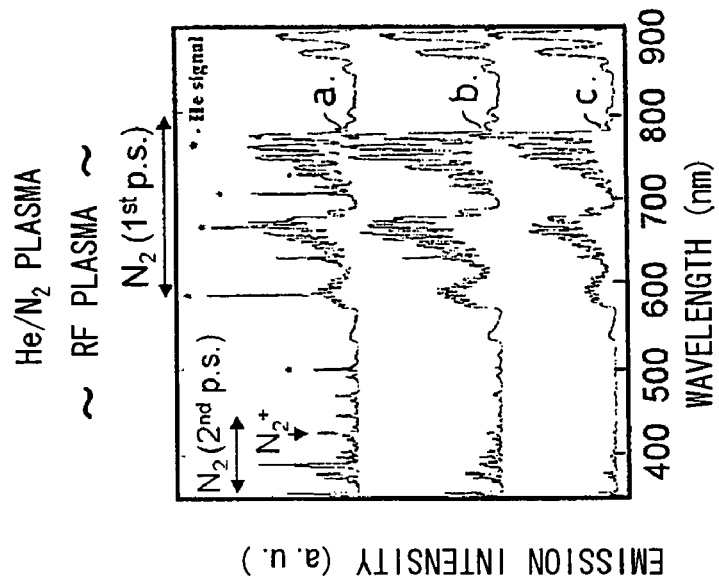

FIG. 10 is a diagram showing the results of spectral analysis on $N_2$ plasma emission and He/$N_2$ plasma emission in comparison with each other. FIG. 10(a) shows He/$N_2$ plasma emission by an RF plasma method. FIG. 10(b) shows $N_2$ plasma emission by an atmospheric pulse plasma method using plasma obtained by applying an electric field in pulse form. The ordinate represents the emission intensity (kcps) and the abscissa represents the wavelength (mn).

FIG. 10(b) can be observed, for example, by using the nitrogen plasma optical emission spectroscopy apparatus 10R shown in FIG. 8. FIG. 10(a) shows He/$N_2$ plasma emission by an RF plasma method using a rare gas (He in this case) conventionally used in ordinary cases. Symbols a., b. and c. in FIG. 10(a) indicate the results of spectral analysis on He/$N_2$ plasma emission based on different He concentrations. The He concentration relating to the spectral analysis results indicated by a. in an upper section in the figure is high. The He concentration relating to the result indicated by b. is lower and the He concentration relating to the result indicated by c. is much lower. In the result indicated by a. in FIG. 10(a) with respect to the RF plasma method in which plasma is generated by using rare gas (He) at a high concentration, nitrogen ions $N_2^+$, $N_2$ ($2^{nd}$ p.s.) and $N_2$ ($1^{st}$ p.s.) appear. Plasma emission indicated by c. in FIG. 10(a) is emission of light from plasma generated by the RF plasma method setting the rare gas (He) concentration extremely low and close to that of pure nitrogen. In film forming by a reduced-pressure plasma method such as an RF plasma method and an ECR plasma method, nitrogen cannot easily be introduced because of a low pressure, so that a nitrogen deficiency can occur easily, as described above. Also, plasma damage occurs and the throughput and the film quality cannot be improved because of film forming under a low pressure. Further, the need for rare gas control and an increase in cost occur due to use of rare gas. In addition to these common drawbacks, each of $N_2$ ($2^{nd}$ p.s.) and $N_2$ (H.I.R), which are the neutral active species in nitrogen plasma considered essential according to the present invention, particularly $N_2$ ($2^{nd}$ p.s.), observed as an active nitrogen species, is hardly generated in plasma generated by using a reduced-pressure plasma method such as an RF plasma method and an ECR plasma method.

This can also be understood from the fact that, in the results of observation of He/$N_2$ plasma shown in FIG. 10(a), while $N_2$ ($2^{nd}$ p.s.) and $N_2$ ($1^{st}$ p.s.) called an $N_2$ first positive system (hereinafter referred as "$1^{st}$ p.s.") are dominant at wavelengths about 300 to 400 nm and at wavelengths about 600 to 900 nm, respectively, irrespective of variations in He/$N_2$ ratio (He concentration) respectively indicated by a., b. and c., $N_2$ ($2^{nd}$ p.s.) observed at wavelengths about 300 to 400 nm is considerably reduced in the situation where the concentration of rare gas (He) is extremely low and close to that of pure nitrogen. In FIG. 10(a), * indicates a He signal. Emission of light from $N_2$ ions $N_2^+$ appears at a wavelength of about 430 nm in the case indicated by a. in FIG. 10(a), where high-concentration rare gas (He) is used. $N_2$ ions $N_2^+$ in this case act as a cause of plasma damage in forming an oxynitride film or an nitride film on a substrate because their impact at the time of impinging is increased in correspondence with electrical energy thereon higher than those on the neutral active species $N_2$ ($2^{nd}$ p.s.) and $N_2$ (H.I.R). The intensity of emission of light from $N_2$ ions $N_2^+$ appearing at a wavelength about 430 nm in the case indicated by a. in FIG. 10(a), where high-concentration rare gas (He) is used, is reduced to an extremely small value in the case b. or c. where the rare gas (He) concentration is reduced by changing the He/$N_2$ ratio. In this case, however, the intensity of emission of light from $N_2$ ($2^{nd}$ p.s.) is also reduced, as mentioned above.

In contrast, in the observation results with respect to the pulse plasma method using plasma obtained by applying an electric field in pulse form, $N_2$ ($2^{nd}$ p.s.) and $N_2$ (H.I.R) are dominant and only a little amount of $N_2$ ions $N_2^+$ is observed.

As apparent from comparison between He/$N_2$ plasma emission by the RF plasma method as shown in FIG. 10(a) and $N_2$ plasma emission by the pulse plasma method as shown in FIG. 10(b), $N_2$ ($1^{st}$ p.s.) is dominant in observation of nitrogen plasma generated as shown in FIG. 10(*a*) by the reduced-pressure plasma method (also called a vacuum plasma method) conventionally used in ordinary cases, and $N_2$ ($2^{nd}$ p.s.) and $N_2$ (H.I.R) are dominant in observation of nitrogen plasma generated as shown in FIG. 10(*b*) by the pulse plasma method. Thus, it is difficult in practice to use a reduced-pressure plasma method such as an RF plasma method or an ECR plasma method for the purpose of obtaining $N_2$ ($2^{nd}$ p.s.) and $N_2$ (H.I.R) which are neutral active species in nitrogen plasma, and generation of $N_2$ ($2^{nd}$ p.s.) and $N_2$ (H.I.R) is realized only by using the plasma method of the present invention in which plasma is generated under a nearly atmospheric pressure by using an alternating electric field.

Figure 11:
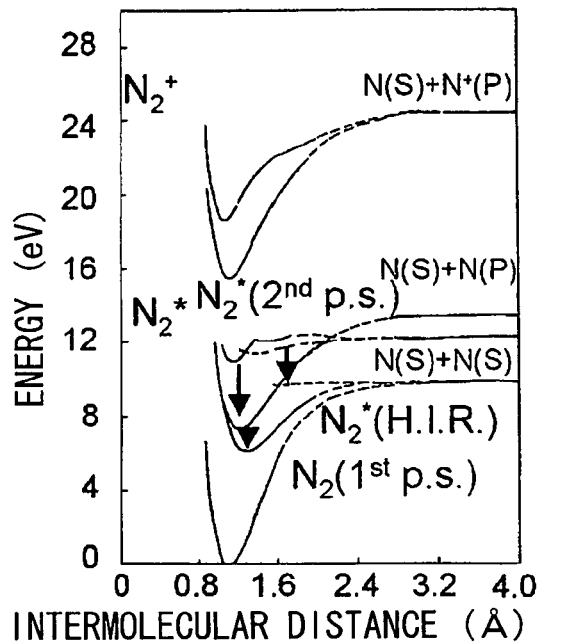
FIG. 11 is a diagram for explaining derivation of the emission spectrum of active nitrogen species.

FIG. 11 is a nitrogen molecule potential energy (eV) diagram for explaining derivation of an emission spectrum.

$N_2$ ($1^{st}$ p.s.), $N_2$ ($2^{nd}$ p.s.) and $N_2$ (H.I.R) are observed as active nitrogen species. The transition states of these species are as indicated by the arrows in FIG. 11. $N_2$ ($1^{st}$ p.s.) is an active nitrogen species in plasma generated by an ECR plasma method or an RF plasma method in which plasma is generated at a reduced pressure. In the conventional ECR plasma method or RF plasma method, this $N_2$ ($1^{st}$ p.s.) is used as nitrogen plasma for film forming or the like. In contrast, according to the present invention, a pulse plasma method is used in which an electric field in pulse form is applied to parallel flat plate electrodes to generate plasma under a nearly atmospheric pressure. Atmospheric nonequilibrium plasma generated by this pulse plasma method is $N_2$ ($2^{nd}$ p.s.) and $N_2$ (H.I.R), which are active excited neutral nitrogen species. $N_2$ ($2^{nd}$ p.s.) and $N_2$ (H.I.R) thus generated are used as nitrogen plasma.

Figure 12:
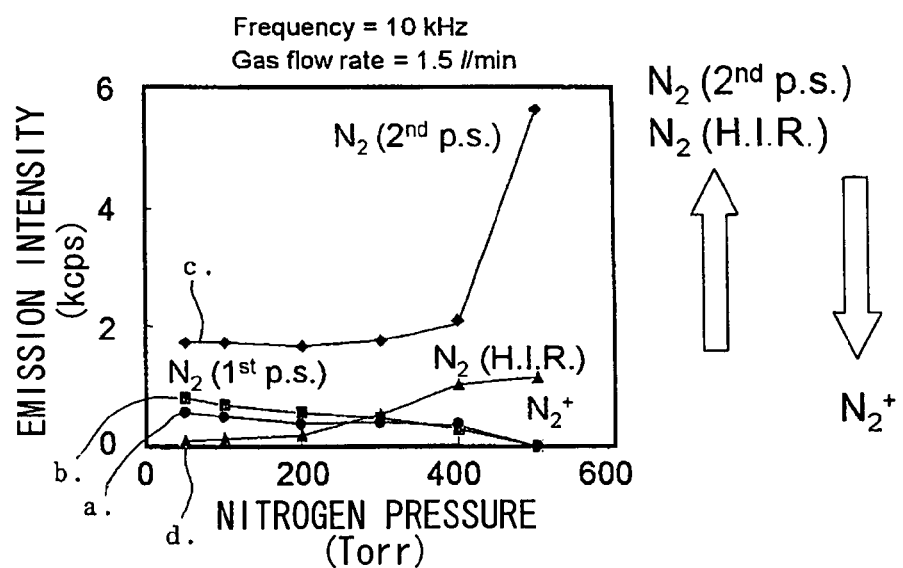
FIG. 12 is a diagram showing the results of optical emission spectroscopy for nitrogen plasma.

FIG. 12 is a diagram showing the results of analysis of emission from nitrogen plasma and showing a discharge pressure dependence of active nitrogen species and nitrogen ions $N_2^+$. The ordinate represents the emission intensity (kcps) and the abscissa represents the nitrogen pressure (Torr). An example of observation when the nitrogen pressure was increased under conditions: a pulse frequency of 10 kHz with respect to pulse application to the discharge electrodes, and a nitrogen gas flow rate of 1.5 liter/min. is shown. In FIG. 12, pressure dependences of emission of nitrogen ions $N_2^+$, $N_2$ ($1^{st}$ p.s.), $N_2$ ($2^{nd}$ p.s.) and $N_2$ (H.I.R) are indicated by a., b., c., and d., respectively.

As shown in FIG. 12, active nitrogen species $N_2$ ($1^{st}$ p.s.) and $N_2$ ($2^{nd}$ p.s.) are generated as nitrogen plasma along with nitrogen ions $N_2^+$ under a low pressure condition close to vacuum, while no active nitrogen species $N_2$ (H.I.R) is generated as nitrogen plasma.

As the nitrogen pressure is increased, $N_2$ ($1^{st}$ p.s.) and nitrogen ions $N_2^+$ are gradually reduced. The intensities of emission of light therefrom become unrecognizable in observation at a nitrogen pressure of about 500 (Torr). The intensity of emission of light from $N_2$ ($2^{nd}$ p.s.) is not substantially changed with the change in nitrogen pressure before a pressure of 400 (Torr) is reached. As the nitrogen pressure is increased from 400 (Torr), the intensity of emission of light from $N_2$ ($2^{nd}$ p.s.) increases abruptly.

On the other hand, $N_2$ (H.I.R) not generated under a low pressure condition close to vacuum is gradually increased as the nitrogen pressure is increased. Almost the entire amount of nitrogen plasma generated at a nitrogen pressure of about 500 (Torr), which is nearly atmospheric pressure, is neutral active species $N_2$ (H.I.R) and $N_2$ ($2^{nd}$ p.s.). As apparent from FIG. 10, the magnitude relationship between the amount of generation of $N_2$ ($1^{st}$ p.s.) and the amount of generation of $N_2$ (H.I.R) is reversed at a nitrogen pressure of about 300 (Torr).

From this, it is thought that $N_2$ ($1^{st}$ p.s.) generated under a low pressure is used as a nitrogen plasma in the conventional reduced-pressure plasma method based on an ECR plasma method or an RF plasma method. In contrast, the pulse plasma method in which plasma is generated under a nearly atmospheric pressure is characterized by using as nitrogen plasma $N_2$ (H.I.R) and $N_2$ ($2^{nd}$ p.s.) which become dominant at nearly atmospheric nitrogen pressures of about 300 (Torr) and about 500 (Torr).

Figure 13A:
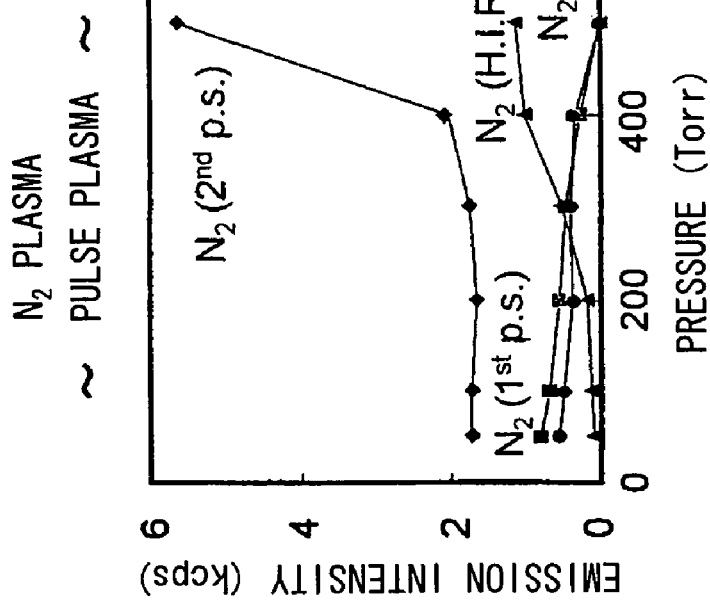
FIG. 13 is a diagram for comparing and explaining discharge pressure dependences of $N_2$ plasma emission and $He/N_2$ plasma emission.
Figure 13B:
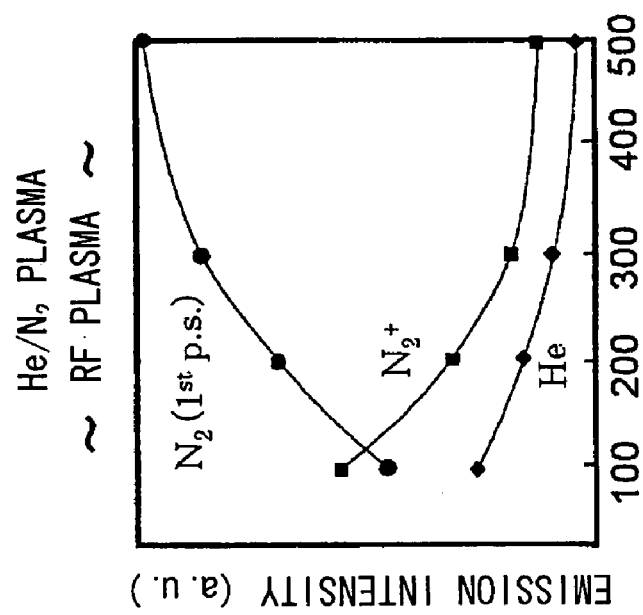

FIG. 13 is a diagram for comparing and explaining discharge pressure dependences of $N_2$ plasma luminescence and He/$N_2$ plasma emission. FIG. 13(*a*) shows a discharge pressure dependence of He/$N_2$ plasma emission by an RF plasma method, and FIG. 13(*b*) shows a discharge pressure dependence of $N_2$ plasma emission by the pulse plasma method. FIG. 13(*b*) is identical to FIG. 12.

FIG. 13(*a*) shows He/$N_2$ plasma emission by an RF plasma method in which nitrogen plasma is generated under a low pressure by using a rare gas (He in this case). As shown in FIG. 13(*a*), only $N_2$ ($1^{st}$ p.s.) is generated through the entire observation pressure region as nitrogen plasma generated by Ne/$N_2$ plasma emission, and substantially no neutral active nitrogen species $N_2$ ($2^{nd}$ p.s.) and $N_2$ (H.I.R) are generated as nitrogen plasma. It is to be noted that $N_2$ ($1^{st}$ p.s.) is dominantly generated in He/$N_2$ plasma even under a pressure close to atmospheric pressure as long as the RF plasma method is used.

According to the pulse plasma method of the present invention in which plasma is generated under a nearly atmospheric pressure, $N_2$ (H.I.R) and $N_2$ ($2^{nd}$ p.s.) can be generated so as to be dominant at nearly atmospheric nitrogen pressures of about 300 (Torr) and about 500 (Torr), as is apparent from comparison with FIG. 13(*b*).

In the results of nitrogen plasma analysis, the discharge space between the electrodes is realized by direct plasma observation (see FIGS. 3 to 7), while the region for diffusion upon blowing off from the region inside the electrode is realized by remote plasma observation (see FIGS. 8 to 10).

The present invention is characterized by using a remote-type method of using plasma blown off the space between electrodes and existing in a diffusion region in pulse plasma methods in which plasma is generated under a nearly atmospheric pressure, and by using $N_2$ ($2^{nd}$ p.s.) and $N_2$ (H.I.R) dominant in the diffusion region as nitrogen plasma for forming an oxynitride film or a nitride film. It is also possible to use for oxynitride film or nitride film forming a direct-type method of using plasma in which $N_2$ ($2^{nd}$ p.s.) is dominant and which exists in the discharge region. A more preferable embodiment is conceivable in which a purer nitrogen gas is applied by using a remote technique using plasma blown off the space between the electrodes under a pressure of 500 (Torr) or higher and existing in the diffusion region to generate $N_2$ (H.I.R) and $N_2$ ($2^{nd}$ p.s.) shown in FIG. 12.

Figure 14:
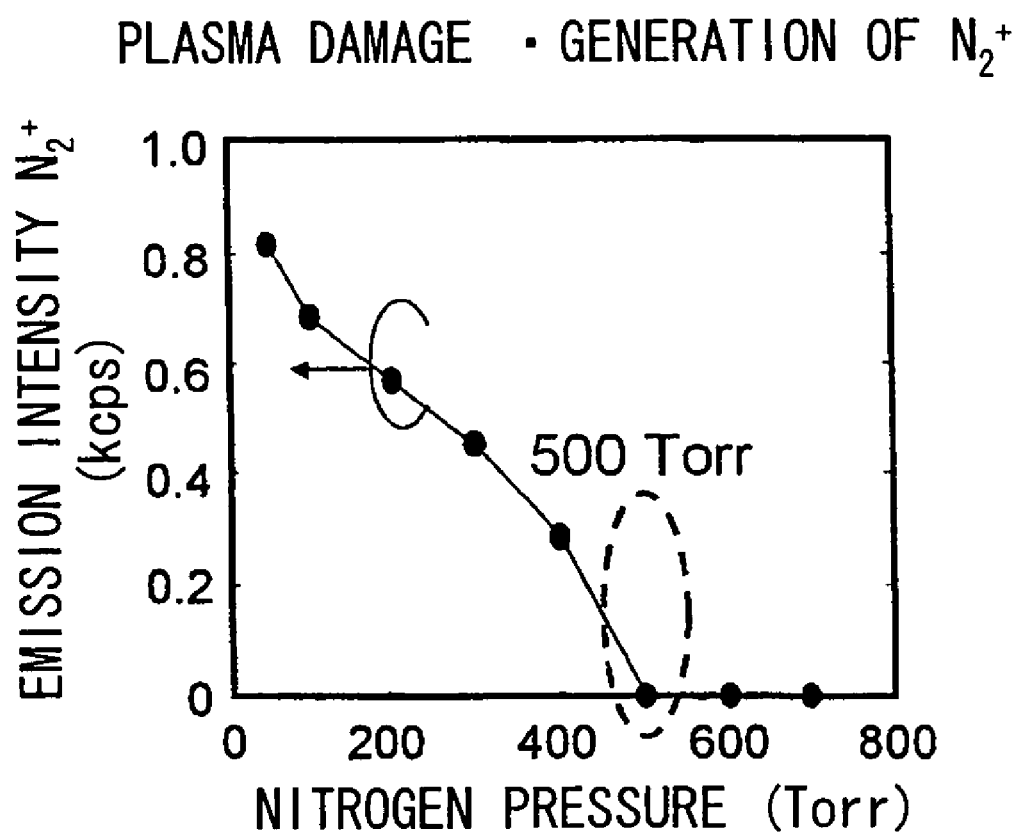
FIG. 14 is a diagram showing a nitrogen pressure dependence of active nitrogen species $N_2^+$.

FIG. 14 is a diagram showing a nitrogen pressure dependence of the active nitrogen species $N_2^+$. As shown in FIG. 14, the generation of nitrogen ions $N_2^+$ thought to correlate with plasma damage can be reduced under a pressure of 500 (Torr) or higher.

Nitriding is performed under a pressure close to atmospheric pressure. Therefore, nitrogen can be easily introduced into an object to be processed, that is, the object can be easily doped with nitrogen.

Further, the generation of nitrogen ions $N_2^+$ is stopped at a nitrogen pressure of 500 (Torr), as shown in FIG. 14 with respect to the nitrogen pressure (Torr). Also from the viewpoint of reducing plasma damage due to nitrogen ions $N_2^+$, therefore, it is effective to use the remote-type or direct-type pulse plasma method under a pressure of 500 (Torr) and to utilize the $N_2$ (H.I.R) and/or $N_2$ ($2^{nd}$ p.s.) active species appearing dominantly.

An embodiment of a nitride film forming apparatus and an oxynitride film forming apparatus according to the present invention will be described in detail with reference the drawings.

Figure 15A:
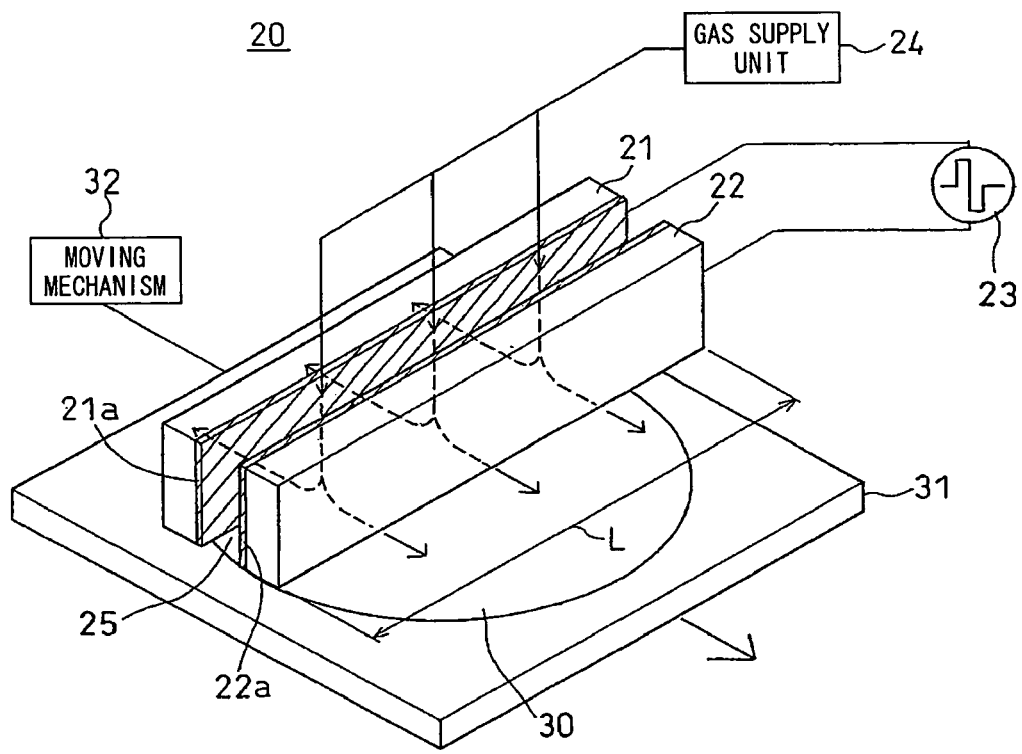
FIG. 15 is a diagram schematically showing the construction of the oxynitride film forming apparatus according to this embodiment.
Figure 15B:
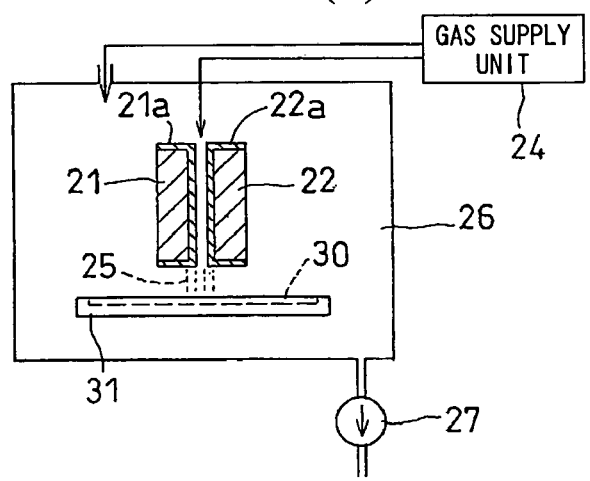

FIG. 15 is a diagram schematically showing the construction of the oxynitride film forming apparatus in this embodiment. FIG. 15 comprises FIG. 15(a) as a perspective view of the apparatus and FIG. 15(b) as a sectional view of the apparatus.

"Nitride film forming apparatus" and "oxynitride film forming apparatus" in this embodiment are names selectively used for convenience' sake according to purities of supplied nitrogen gas, and refer to basically the same construction. If a nitrogen gas having as an oxygen source only an extremely low content (e.g., 1 ppm or less) of $O_2$, water ($H_2O$) or an oxide is used as supplied gas, the apparatus is called a nitride film forming apparatus. If a nitrogen gas containing $O_2$, water ($H_2O$) or an oxide at higher than this extremely low content (e.g., 1 ppm) and equal to or smaller than 0.2% is used, the apparatus is called an oxynitride film forming apparatus. This nitride film forming apparatus is implemented by attaching a filter capable of selectively adsorbing $O_2$, water ($H_2O$) or an oxide to a nitrogen gas supply unit of an oxynitride film forming apparatus described below. An oxynitride film forming apparatus will be representatively described below.

Referring to FIG. 15, an oxynitride film forming apparatus 20 is an apparatus for forming, by using a remote-type pulse plasma method, an oxynitride film on a substrate 30 such as a wafer or an electronic substrate, which is an object to be processed. The oxynitride film forming apparatus 20 has a pair of parallel flat plate discharge electrodes 21 and 22 having opposed surfaces on which solid dielectrics 21a and 22a containing substantially no oxide are provided, a power supply 23 for applying an alternating electric field (e.g., an electric field in pulse form) between the opposed discharge electrodes 21 and 22, a nitrogen gas supply unit 24 for supplying nitrogen gas, a chamber 26 provided as a reaction container, and a pump 27 for exhausting air. Reference numeral 25 denotes plasma generated between the discharge electrodes 21 and 22. Nitrogen gas supplied from the nitrogen gas supply unit 24 to a region inside the discharge electrodes 21 and 22 (between the electrodes) from above the electrode plates is changed into plasma by an electric field in pulse form and blown off a lower portion of the space between the electrode plates to a position below the discharge electrodes 21 and 22. A reaction section of the oxynitride film forming apparatus 20 is provided in the chamber 26. Referring to FIG. 15(b), when an oxynitride film is formed on the substrate 30, the interior of the chamber 26 is first purged with nitrogen gas and nitriding is performed by maintaining the pressure therein, for example, at 500 Torr.

The substrate 30 is placed on a wafer tray 31. The wafer tray 31 is moved by a moving mechanism 32 arranged to enable the entire surface of the substrate 30 to be uniformly processed. The moving mechanism may alternatively be arranged to move a head side on which the discharge electrodes 21 and 22 are provided, instead of moving the wafer tray 31. If a mechanism capable of adjusting the speed of feeding of a conveyance belt or the like as desired is used as the moving mechanism 32, the nitriding time during which exposure to nitriding plasma is continued can be made variable to enable control of the thickness of formed film, as described below. A heating mechanism for hearing the substrate 30 may be further provided on the wafer tray 31. In such a case, the temperature at which the substrate 30 is heated from the wafer tray 31 is preferably 50° C. or higher, more preferably 100° C. or higher. If an oxynitride film is formed by heating the substrate 30 in this way, stable binding of nitrogen with the object to be processed (substrate) can be ensured and replacement of unstably-bound nitrogen with oxygen can be prevented after moving the substrate 30 on which the oxynitride film is formed into atmosphere by taking the substrate 30 out of the chamber 26 to limit oxidation thereafter.

The oxynitride film forming apparatus 20 blows the nitrogen gas supplied from the nitrogen gas supply unit 24 to the surface of the substrate 30 provided as an object to be processed. The power supply 23 applies the electric field in pulse form to the discharge electrodes 21 and 22 to change the nitrogen gas into plasma to be blown to the surface of the substrate 30.

[Atmospheric Pressure]

The oxynitride film forming apparatus 20 performs processing under a nearly atmospheric pressure. The nearly atmospheric pressure is a pressure of 300 to 1000 Torr (about $3.999 \times 10^4$ to $13.33 \times 10^4$ Pa) such that the pressure control is facilitated and a device used for discharge plasma processing can be simplified. A pressure of 500 Torr (about $6.665 \times 10^4$ Pa) or higher at which the neutral active species $N_2$ ($2^{nd}$ p.s.) and $N_2$ (H.I.R) are dominant (see FIG. 12) and at which plasma damage due to the nitrogen ion $N_2^+$ species is eliminated (see FIG. 14) is particularly preferred. Also it is preferable to set the pressure to 800 Torr or lower for stabilization by avoiding the occurrence of abnormal electric discharge.

The surface of the substrate 30 on which oxynitride film is formed may be heated or maintained at room temperature. In ordinary cases, the temperature of the substrate 30 is suitably set by considering damage to the substrate, the film forming speed, coverage, the film thickness, and so on. However, the oxynitride film formed by the oxynitride film forming apparatus 20 in this embodiment has substantially no nitriding time/temperature dependence as described below and can be uniformly formed in an extremely short time, and the thickness of the formed film can be controlled through the amount of generation of the neutral active species $N_2$ (H.I.R) and/or $N_2$ ($2^{nd}$ p.s.) or the nitriding time. Further, since plasma damage itself does not occur, the restrictions on the nitriding time and nitriding temperature conditions are markedly relaxed in comparison with the conventional film formation method. In this embodiment, a temperature in the rage from room temperature to 500° C. was used as a nitriding temperature.

[Nitrogen Gas]

As nitrogen gas in forming the oxynitride film of the present invention, a high-purity nitrogen gas having a nitrogen gas content of 99.9998 to 99.9999% is used. The existence of components other than nitrogen gas is due to mixing of a very low content of $O_2$ or water ($H_2O$) in the high-purity nitrogen gas. In the method for forming an oxynitride film in this embodiment, film forming is performed under a high pressure of 500 Torr or higher under nearly atmospheric pressure and, therefore, the above-described high-purity nitrogen gas is used and the pressure in the chamber 26 is adjusted to a nearly atmospheric pressure. To do so, the interior of the chamber 26 is temporarily exhausted to high vacuum and is. thereafter purged by introducing a large amount of nitrogen gas. It has been experimentally found that, because of this operation, a suitable amount of $O_2$ or an oxide such as $H_2O$ remaining even after exhausting the interior of the chamber 26 to high vacuum exist before forming the oxynitride film. According to an experiment, even in a case where the pressure in the chamber 26 is adjusted to a high pressure of 500 Torr or higher under nearly atmospheric pressure by using the above-described high-purity nitrogen gas, water ($H_2O$) having an extremely low partial pressure (e.g., several milliTorr) may be contained as an impurity in the system of the oxynitride film forming apparatus 20 in the chamber 26.

The above-described high-purity nitrogen gas is a gas which is called high-purity nitrogen gas in the conventional thermal nitriding method using a mixture gas formed of nitrogen gas and rare gas, and which can be prepared without any special processing. Therefore the above-described high-purity nitrogen gas can be easily introduced. That is, the above-described high-purity nitrogen gas may be used without adjusting the nitrogen gas-rare gas mixture conditions, and there is no need for strict control and adjustment of $H_2O$ or $O_2$ for forming the oxynitride film. Although the above-described high-purity nitrogen gas was used without being specially controlled or adjusted, uniform SiON film having extremely high dielectric and leak current characteristics was obtained. Thus, enabling use of the high-purity nitrogen gas as is without requiring mixture ratio adjustment leads to a reduction in cost and has the effect of facilitating implementation.

[Discharge Electrode]

The discharge electrodes 21 and 22 are formed of a metal such as an iron, copper or aluminum in a single state, an alloy such as stainless steel or brass, an intermetallic compound, or the like. The distance at least between the opposed surfaces of the electrodes is made constant to prevent arc discharge, and the solid dielectric is disposed on each electrode surface. As the solid dielectric, any of various materials including ordinary alumina or glass, a plastic such as polytetrafluoroethylene terephthalate or polyethylene terephthalate, and a composite of some of these materials may be used. More preferably, the solid dielectric is aluminum nitride AlN, silicon nitride $Si_3N_4$, boron nitride BN, or the like. Preferably, the thickness of the dielectric layer is about 0.01 to 4 mm. Preferably, the dielectric constant of the solid dielectrics 21a and 22a is 2 or higher (in a 25° C. environment, which condition will also apply in the following). It is also possible to cover the outer peripheral surfaces of the electrodes with a ceramic, a resin or the like in the form of a plate, sheet or film. In this embodiment, aluminum nitride AlN was used as the solid dielectrics 21a and 22a.

Figure 16A:
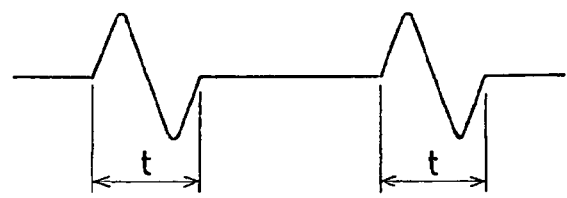
FIG. 16 is a diagram showing a pulse voltage waveform output from a power supply.

A voltage in the form of radiofrequency waves, alternating current waves comprising microwaves, pulse waves, waves formed as a combination of these waves, or the like is applied to a space between the discharge electrodes 21 and 22 from a power supply 23 to generate plasma. It is preferable to apply the voltage in pulse form. Preferably, the voltage in pulse form formed by the power supply 23 is of an impulse type having, for example, as shown in FIG. 16(a), a voltage rise/fall time of 10 µs or less, preferably 1 µs or less, an electric field intensity of about 10 to 1000 kV/cm, preferably 50 to 1000 kV/cm, a frequency of about 0.5 kHz to 1 MHz, a duration time of 0.5 to 200 µs, and an off time of 0.5 to 1000 µs, preferably 0.5 to 500 µs. The speed of processing for forming nitride film is adjusted by changing the voltage and pulse frequency applied to the electrodes.

Figure 16B:
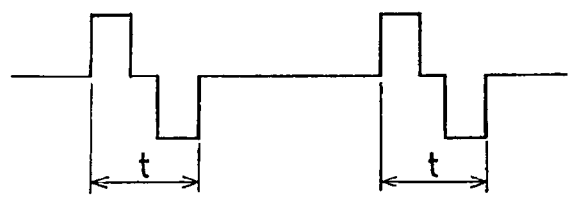

The distance between the electrodes to which the above-described voltage is applied is 0.1 to 5 mm, preferably 5 mm or less from consideration of the uniformity of discharge. In the case of the direct type using plasma existing in the discharge region, the distance is preferably 0.5 to 2 mm. In the case of the remote type using plasma blown off the region inside the electrodes and existing in the diffusion region, the distance is preferably 0.1 to 2 mm. The current density is 10 to 5000 mA/cm$^2$, preferably 50 to 500 mA/cm$^2$. As the pulse voltage waveform, any of suitable waveforms, e.g., a rectangular waveform such as shown in FIG. 16(b) or a modulated waveform other than the illustrated impulse type may be used. While examples of the waveform of voltage repeatedly applied with positive and negative polarities are shown in FIG. 16, a waveform of voltage applied with one of positive and negative polarities, i.e., a one-sided waveform, may also be used. Also, a bipolar waveform may be used.

The pulse voltage waveform output from the power supply 23 is not limited to those mentioned above. However, ionization of gas at the time of plasma generation can be performed more efficiently if the pulse rise time is shorter. If the pulse rise time is longer than 100 µs, transition of the state of discharge to arc discharge can occur easily; the state of discharge is unstable; and a high-density plasma condition by the pulse voltage cannot be expected. A shorter rise time is preferred. However, there are restrictions on a device having an electric field intensity for generating plasma at atmospheric pressure and capable of generating a short-rise-time electric field, and it is, therefore, difficult in practice to realize a pulse voltage with a rise time shorter than 40 ns. More preferably, the rise time is 50 ns to 5 µs. In this specification, "rise time" refers to a time period during which a change in voltage is continuously positive.

Preferably, the pulse voltage fall time is also short, 100 µs or less, as is the rise time. In the voltage in pulse form of FIG. 16(a) used in this embodiment, the rise time and fall time are set substantially equal to each other. Further, modulation may be performed by using pulses differing in pulse waveform, rise time and frequency. Preferably, the frequency of the voltage in pulse form is 0.5 kHz to 1 MHz. If the frequency is lower than 0.5 kHz, the plasma density is so low that the time required or processing is disadvantageously long. If the frequency exceeds 1 MHz, a need for adjustment of input power and reflected power for matching or the like arises in some case of discharge under a high pressure exceeding 500 Torr depending on the size and construction of the electrodes. More preferably, the frequency is 1 kHz or higher. If a pulse voltage of such a high frequency is applied, the speed of plasma processing can be largely increased. The upper limit of the frequency is not particularly specified. The frequency may be set to in a high-frequency band, e.g., a frequency band at 13.56 MHz ordinarily used or a frequency band at 500 MHz in trail use. From consideration of the facility of matching with a load or handling, the frequency is preferably 500 MHz or less. If a pulse voltage of such a frequency is applied, the processing speed can be largely increased.

The duration time of the pulse in the voltage in pulse form is preferably 0.5 to 200 µs. If the duration time is shorter than 0.5 µs, discharge is unstable. If the duration time exceeds 200 µs, transition of the state of discharge to arc discharge can occur easily. More preferably, the duration time is 3 to 200 µs. The duration time of one pulse is a time period indicated by t in FIG. 16, during which the pulse in a pulse voltage repeatedly turned on and off is sustained.

The amplitude of discharge voltage in pulse form shown in FIG. 16 is determined as required. In this embodiment, however, it is set within such a range that the intensity of the electric field between the electrodes is 10 to 1000 kV/cm, preferably 20 to 300 kV/cm. The reason for setting in this range is that the time required for processing is considerably long if the electric field intensity is lower than 10 kV/cm, and arc discharge can occur easily if the electric field intensity exceeds 1000 kV/cm. Also, a direct current may be superimposed in application of the voltage in pulse form.

[Si material]

The process material (material to be processed) in this embodiment is silicon wafer 30. In forming oxynitride film by plasma processing of the present invention, the surface temperature of the silicon wafer relates to the above-mentioned heating temperature of the wafer tray 31. The surface temperature of the silicon wafer is preferably 50° C. or higher, more preferably 100° C. or higher. Needless to say, any object to be processed other than the silicon wafer may be provided as a material.

[Remote Type]

The oxynitride film forming apparatus 20 in this embodiment uses, as nitrogen plasma, $N_2$ (H.I.R) and $N_2$ ($2^{nd}$ p.s.) generated at a nitrogen pressure of 500 (Torr) or higher under nearly atmospheric pressure as shown in the optical emission spectroscopy in FIG. 12 and, therefore, adopts the remote type using plasma blown off the region inside the electrodes and existing in the diffusion region as described above with reference to FIGS. 8 and 9.

In the remote type, plasma generated between the discharge electrodes 21 and 22 opposed as shown in FIG. 15 is directed toward the silicon wafer 30 placed outside the discharge space to be brought into contact with the silicon wafer 30.

Examples of this remote type include a method in which the solid dielectrics are extended so as to form a plasma guide nozzle to blow toward the silicon wafer placed outside the discharge space. A combination of a lengthwise nozzle (not shown in FIG. 15(b)) attached to silicon wafer 30 side edge portions of the parallel flat plate electrodes and the electrode plates of these electrodes and a cylindrical nozzle attached to silicon wafer 30 side portions of coaxial cylindrical electrodes and the electrode plates of these electrodes may be used. The material of the nozzle tip is not necessary the same as the above-described solid dielectric. It may be a metal or the like if it is insulated from the electrodes.

Among these, the method of blowing plasma generated between the opposed electrodes to the silicon wafer through the solid dielectrics having a gas blowing nozzle is a preferable method capable of reducing electrical thermal burden on the silicon wafer because it limits direct exposure of silicon wafer 30 to high-density plasma and enables the gas in plasma state to be moved only to a target place on the silicon wafer surface to form oxynitride film. Further, this method enables application of a bias to the silicon wafer side of the substrate to be processed.

In forming oxynitride film by plasma processing according to the present invention, predischarge for improving the film quality may be started immediately after the generation of plasma and continued until discharge becomes stabilized, followed by contact with the member to be processed.

Also, there is a need to perform processing in an inert gas atmosphere in order to prevent the silicon wafer or the oxynitride film during forming from contacting moist air in atmospheric air or other impurities. To do so, a device may be used as in addition to the device for forming the oxynitride film by bringing the above-described plasma into contact with the silicon wafer. For example, the added device covers the device for forming the oxynitride film and is provided with a mechanism for maintaining an inert gas atmosphere in the vicinity of the contact between the plasma and the silicon wafer, as is the chamber 26 shown in FIG. 15(b). As this inert gas, a gas such as a rare gas to which oxygen cannot bind and which contains no oxygen may be filled. While in the arrangement shown in FIG. 15(b) nitrogen is also supplied from the gas supply unit 24 to the interior of the chamber 26 around the electrodes, a certain gas containing no oxygen may suffice as the gas to be supplied to the interior of the chamber 26 around the electrodes, and the gas to be supplied to the interior of the chamber 26 around the electrodes is not limited to a rare gas or nitrogen to be introduced into the space between the electrodes.

As a means for conveying the silicon wafer, a conveyer system comprising a conveyor, a conveyance robot or the like may be used.

The operation of the oxynitride film forming apparatus 20 constructed as described above will be described below.

As shown in FIG. 15, high-purity nitrogen gas having a nitrogen gas concentration of 99.9998 to 99.9999% is supplied to the space between the opposed discharge electrodes 21 and 22; the voltage in pulse. form from the power supply 23 is applied between the discharge electrodes 21 and 22 covered with the solid dielectrics 21a and 22a formed AlN to generate glow discharge plasma; and the nitrogen gas introduced into the space between the discharge electrodes 21 and 22 is changed into plasma and blown from the gas outlet below the discharge electrodes 21 and 22 to the surface of the silicon wafer substrate 30.

The nitrogen gas changed into plasma is a neutral active species in which $N_2$ ($2^{nd}$ p.s.) and $N_2$ (H.I.R) generated at a pressure of 300 (Torr), particularly 500 (Torr) or higher in the diffusion region are dominant. A silicon oxynitride film of good quality is formed on the substrate surface of the silicon wafer 30 by $N_2$ ($2^{nd}$ p.s.), $N_2$ (H.I.R) and an oxide derived from a very small content such as $O_2$ or water ($H_2O$) in the high-purity nitrogen gas. Oxynitriding of this oxynitride film is completed in a short time as described below. Film forming of this oxynitride film is stopped when the desired film thickness (e.g., 1.6 nm) is obtained. Also, this oxynitride film has good film quality and improved uniformity and is, therefore, particularly effective in making a quantum device using a quantum structure.

Discharge under a nearly atmospheric pressure using a pulse electric field according to the present invention does not at all require the rare gas required to generate plasma with stability in the RF method, and can be directly caused between the electrodes at a nearly atmospheric pressure to realize high-speed processing at a low temperature, e.g., room temperature by an atmospheric plasma apparatus and processing method using a simpler electrode structure and a simpler discharge procedure. Also, parameters relating to the formation of the oxynitride film, e.g., the pulse frequency, the voltage and the electrode distance can be adjusted.

While in this embodiment the oxynitride film is formed by supplying the above-described high-purity nitrogen gas, a good nitride film can be formed only by changing the gas to be supplied to a nitrogen gas having only an extremely low content (e.g., 1 ppm or less) of $O_2$ or an oxide such as $H_2O$ as an oxygen source, without requiring any change in the arrangement shown in FIG. 13.

The nitrogen gas is a high-purity nitrogen gas containing, preferably, only 1 ppb or less of oxygen or an oxide as an oxygen source and can be easily realized by attaching a filter capable of selectively adsorbing $H_2O$ or $O_2$ to the nitrogen supply unit 24 of the oxynitride film forming apparatus 20 or in the nitrogen gas introduction line from the nitrogen supply unit 24.

EXAMPLE 1

An experiment was carried out by using the oxynitride film forming apparatus 20 constructed as described above, by setting the pressure to 500 Torr, the nitrogen gas flow rate to 10 liters/min., the applied voltage to 3.36 kV, the pulse frequency to 30 kHz, the nitriding time to 30 sec. to 10 min., and the nitriding temperature to room temperature to 500° C., and by using p-type (111) Si as a substrate to be processed. Also, the width L of the discharge electrodes 21 and 22 of the oxynitride film forming apparatus 20 was 20 mm; the height of the discharge electrodes 21 and 22 in the gas flow channel direction, 15 mm; the distance between the discharge electrodes 21 and 22, 1 mm; and the distance between the blowing port of the discharge electrodes 21 and 22 (a nozzle tip in the arrangement using a nozzle, or side edge portions of the electrode plates on the side of the process substrate in the arrangement using these portions as a nozzle) and the process substrate, 5 mm. The results of this experiment will be described below.

The reason for the fact that the neutral active species $N_2$ ($2^{nd}$ p.s.) and $N_2$ (H.I.R) are dominant only in plasma blown off the region inside the electrodes as observed by the remote type, as described above with reference to FIG. 9, is not clear. However, it is thought that the necessary active nitrogen species remains at a certain distance as a result of the process in which various kinds of plasma excited in the discharge region inside the electrodes are diffused by being blown out of the blowing port while repeating impinging against each other. Accordingly, the distance between the blowing port of the discharge electrodes 21 and 22 and the process substrate is important as a condition for forming a good oxynitride film. In this example, the distance between the blowing port of the discharge electrodes 21 and 22 and the process substrate was set to 5 mm and the nitrogen gas flow rate was set to 2 to 10 liters/min. in the above-described construction conditions for the oxynitride film forming apparatus 20. Therefore, if detailed experimental results can be obtained with respect to the nitrogen plasma spatial distribution in the diffusion region when the distance and the gas flow rate are used as parameters can be obtained, oxynitride film forming can be performed with further improved accuracy.

In this example, film forming is performed by using the above-described remote-type oxynitride film forming apparatus 20 and a 99.9998 to 99.9999% high-purity nitrogen gas under a high pressure of 500 Torr or higher under nearly atmospheric pressure. Therefore, an oxynitride film in which oxygen and nitride coexist can be formed even in an environment having only a very low content of $O_2$. In this example, an extremely low content of an oxide contained as an impurity in a 6 nine high-purity nitrogen gas is used. Even in the embodiment using an oxide as an impurity, an effect of forming an oxynitride film having improved characteristics, i.e., a high dielectric constant and a low leak current, unlike the conventional films, was achieved because the film forming process of the film oxynitride film forming apparatus 20 itself is improved. The results of a quantitative study of nitrogen gas-oxide mixture conditions will be described below.

FIG. 17 is a diagram showing conditions for nitriding of an Si substrate. FIG. 17(a) shows a high-speed electron beam diffraction image of an Si surface before irradiation with nitrogen plasma. As can be understood from the high-speed electron beam diffraction image shown in FIG. 17(a), an Si substrate (silicon wafer) having no natural oxide film on its surface was used as a process material (object to be processed).

FIG. 17(b) shows the results of analysis of the existence of a residual gas in the chamber 26 at a back pressure of $9 \times 10^{-10}$ Torr before nitrogen gas was introduced into the chamber 26 after exhausting the interior of the chamber 26 to high vacuum in a process in which the interior of the chamber 26 was temporarily exhausted to high vacuum; the interior of the chamber 26 was thereafter purged by introducing a large amount of nitrogen gas; and the pressure in the chamber 26 was adjusted. In this case, as shown in FIG. 17(b), $O_2$ remained at $4.99 \times 10^{-8}$ (Pa), i.e., $3.74 \times 10^{-10}$ Torr and $H_2O$ remained at $5 \times 10^{-7}$ (Pa), i.e., $3.75 \times 10^{-10}$ Torr in the chamber 26 in which the oxynitride film forming apparatus 20 is installed.

A nitride film is formed by using the oxynitride film forming apparatus 20 and a nitrogen gas having only an extremely low content (e.g., 1 ppm or less) of $O_2$, water ($H_2O$) or an oxide as an oxygen source under a high pressure of 500 Torr or higher under nearly atmospheric pressure. A good nitride film can be formed only by changing the gas to be supplied to a 100% nitrogen gas. The 100% nitrogen gas can be easily realized by attaching a filter capable of selectively adsorbing $H_2O$ or $O_2$ to the nitrogen supply unit 24 of the oxynitride film forming apparatus 20.

FIG. 18 is a diagram showing the results of X-ray photoelectric spectroscopy (XPS) measurement on a nitride film formed on a Si substrate by the apparatus and method in this example under film forming conditions: a nitriding temperature of 350° C., and a nitriding time of 10 min. The ordinate represents the peak intensity (a.u.) and the abscissa represents the binding energy (eV). FIG. 18(a) shows narrow spectrum measurement results with respect to Si, and FIG. 18(b) shows narrow spectrum measurement results with respect to N.

The XPS measurement results shown in FIG. 18 is an example of an experiment in which a high-purity nitrogen gas (99.9998%) was passed through a high-purity gas filter so that the oxide source ($H_2O$, $O_2$) was 1 ppb or less.

By setting the oxide source ($H_2O$, $O_2$) in the high-purity nitrogen gas (99.9998%) to 1 ppb or less, a peak due to Si—N binding about a binding energy level of 102 (eV) was observed, as shown in FIG. 18(a). From this, it was confirmed that $Si_3N_4$ nitride film was formed.

By more detailed analysis, it was found that the formed nitride film was nitride film ($Si_3N_{3.5}O_{0.7}$).

FIG. 19 is a diagram showing the state of binding in the depth direction of the nitride film formed by the apparatus and method in this example. FIG. 19(a) shows narrow spectrum measurement results with respect to Si, and FIG. 19(b) shows narrow spectrum measurement results with respect to N. Measurements were made by X-ray photoelectric spectroscopy. The ordinate represents the peak intensity and the abscissa represents the binding energy (eV). In FIG. 19, indicating portions of individual peak curves in the plurality of peak curves are brought closer to the Si substrate side from the formed nitride film surface side in order from the top to bottom positions in the figure. The lowermost peak curve corresponds to the Si substrate. Since in this example there was substantially no oxide source ($H_2O$, $O_2$) (the oxide source was 1 ppb or less), no peak due to $SiO_2$ appears. Also, it was confirmed that, as apparent from FIG. 19(b), Si—N binding was distributed uniformly in the depth direction.

Description will next be made of device characteristics of the nitride film formed by the apparatus and method in this example.

Figure 20:
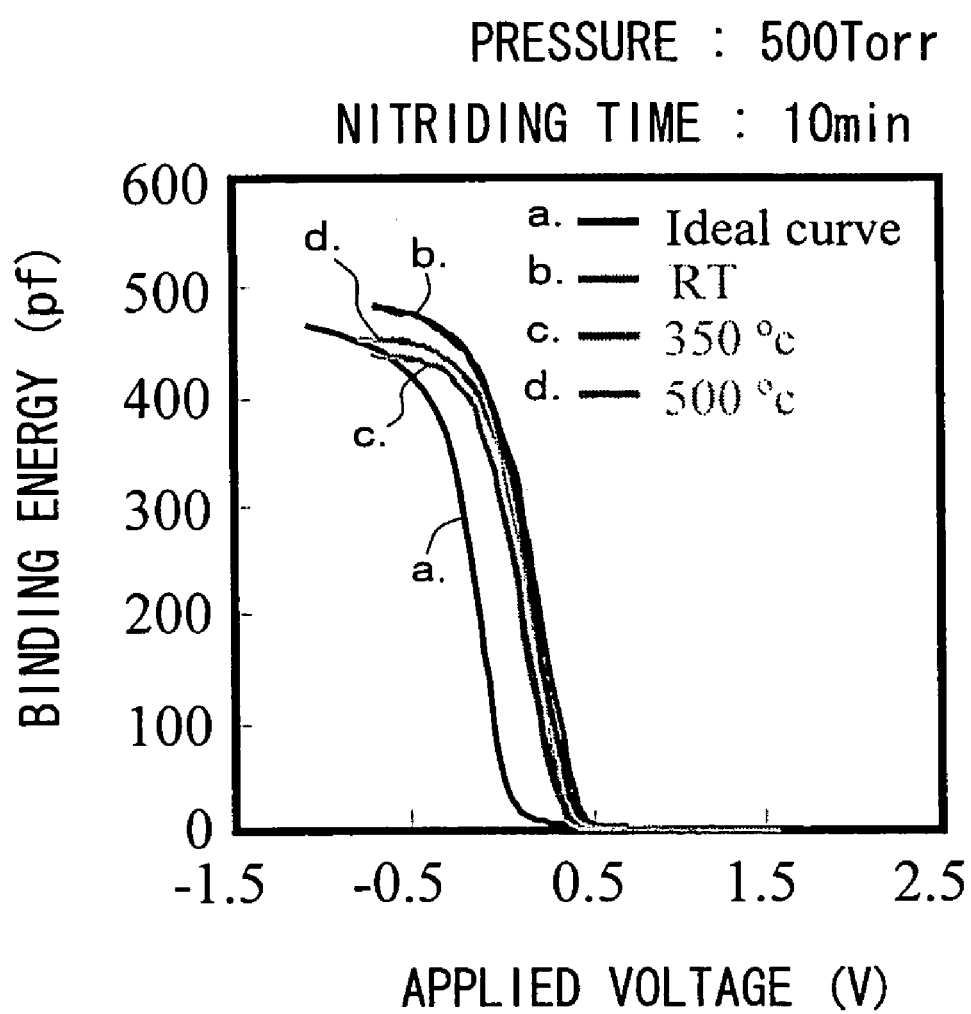
FIG. 20 is a diagram showing dielectric characteristics of nitride films formed by the apparatus and method under film forming conditions with different film forming temperatures.

FIG. 20 is a diagram showing dielectric characteristics of nitride films each formed by the apparatus and method changing under film forming conditions: a nitriding temperature equal to room temperature (RT), 350° C., or 500° C., and a nitriding time of 10 min.

FIG. 20 is the results of measurement of the capacitance ($\mu F/cm^2$) of the nitride films with respect to an applied voltage (V) having a frequency of 10 kHz.

Even with respect to the different nitriding temperatures: b. room temperature (RT), c. 350° C., d. 500° C. in the C—V characteristic measurement as shown in FIG. 20, device characteristics as expressed by experimental values b. to d. similar to a theoretical curve a. (Ideal curve) were obtained.

Figure 21:
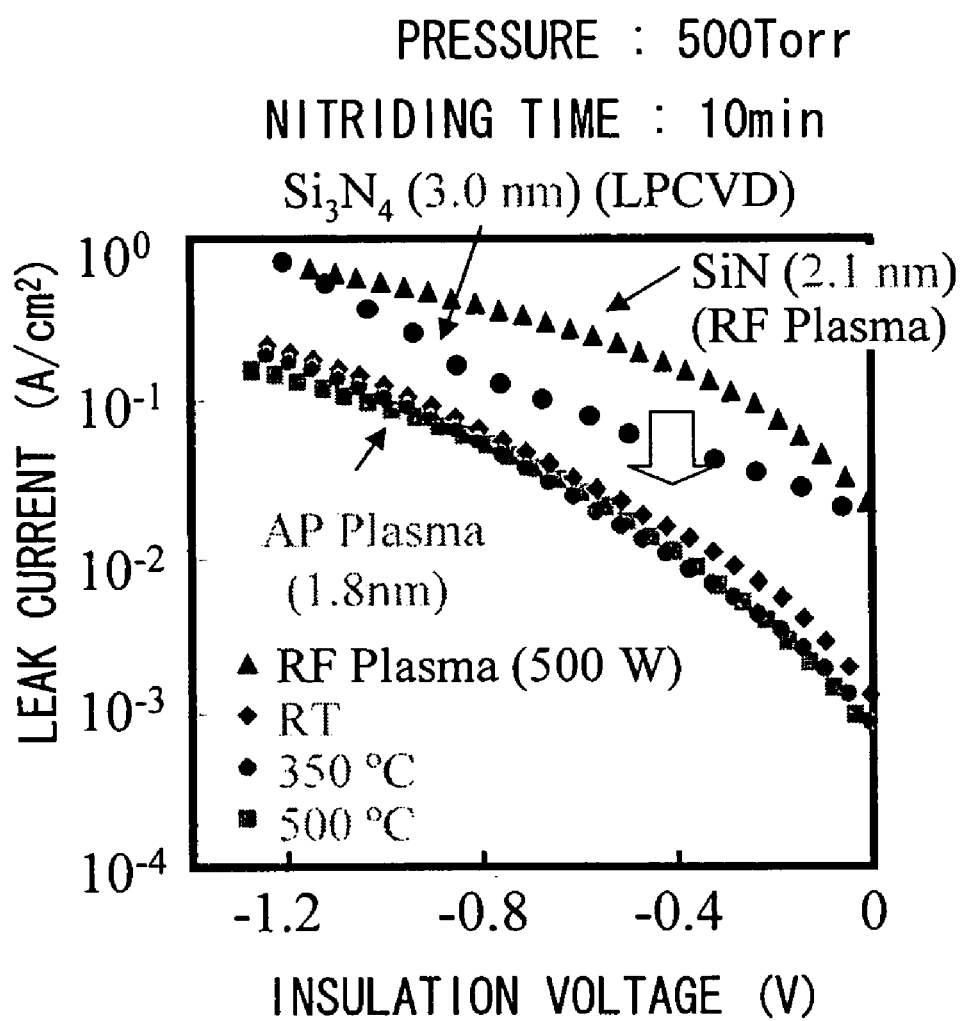
FIG. 21 is a diagram showing comparison between leak current characteristics of nitride films.

FIG. 21 is a diagram showing comparison between leak current characteristics of nitride films.

As shown in FIG. 21, 1.8 nm thick nitride films formed by the apparatus and method in this example using an atmospheric pressure plasma method (AP plasma) based on a pulse plasma method while setting different nitriding temperatures: room temperature (RT), 350° C., and 500° C. have leak currents one or two orders of magnitude smaller than those of a 3.0 nm thick direct nitride film ($Si_3N_4$) formed by a low-pressure CVD (LPCVD) and a 2.1 nm thick direct nitride film (SiN) formed by an RF plasma method using a radical gun, and thus have improved electrical characteristics (insulating properties), although their film thicknesses are small.

Analysis as to the reason why the leak current is remarkable as described above is presently being conducted. The reason will be examined through analysis of leak current described below.

Figure 22:
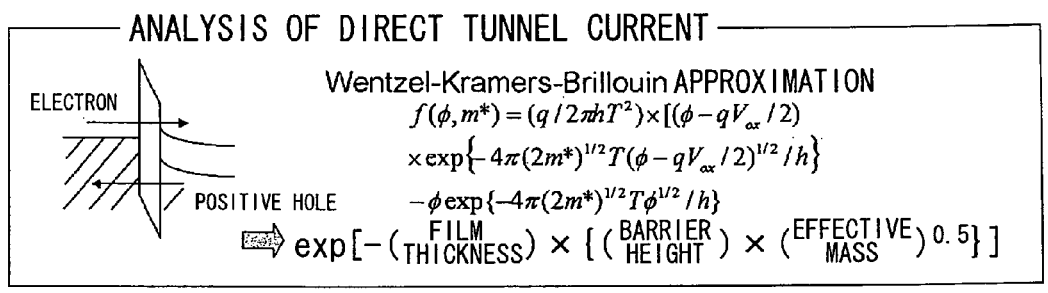
FIG. 22 is a diagram for explaining analysis of a direct tunnel current.

FIG. 22 is a diagram for explaining analysis of a direct tunnel current relating to a leak current.

As leak currents in leak current effects to be mentioned as a leak current transmission mechanism, (1) Pool-Frenkel emission current, (2) Schottky emission current, (3) F—N tunnel current, and (4) direct tunnel current are known. From theoretical values and experimental results, the inventors of the present invention supposed that only a leak current based on a direct tunnel current is playing a role. Leak currents due to (1) to (3) shown above can be said to be low-quality leak currents, while direct tunnel current (4) can be said to a leak current appearing in an ideal insulating film. Also from this, the oxynitride film formed by the apparatus and method of this example has ideal characteristics as an insulating film. It is supposed that direct tunnel current (4) described above can be simulated by the Wentzel-Kramers-Brillouin formula, and that the increase in effective mass* relates to a leak current based on direct tunnel current (4).

Figure 23:
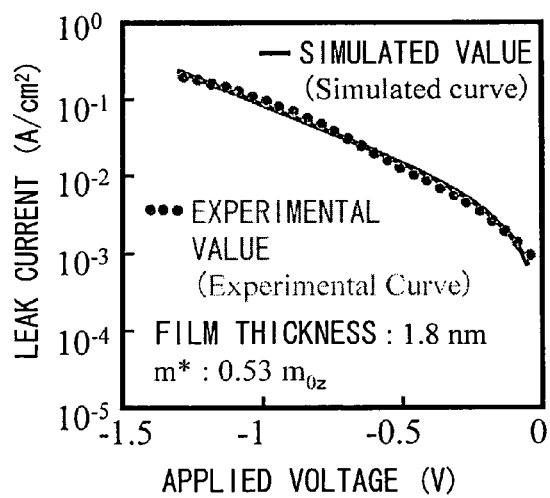
FIG. 23 is a diagram showing the results of measurement of applied voltage (V)-leak current ($A/cm^2$) of the 1.8 nm thick nitride film formed by the apparatus and method of this example.

FIG. 23 is a diagram showing the results of measurement of applied voltage (V)-leak current ($A/cm^2$) of the 1.8 nm thick nitride film formed by the apparatus and method of this example under film forming conditions: a pressure of 500 Torr under nearly atmospheric pressure, a nitriding temperature of 350° C., and a nitriding time of 10 min. Also in this case, experimental values (experimental curve) generally conforms to simulated values (simulated curve) obtained by simulation with the Wentzel-Kramers-Brillouin formula, in spite of the pressure set closer to atmospheric pressure, i.e., 500 Torr under nearly atmospheric pressure. From this, it is thought that the nitride film formed by the apparatus and method of this example is increased in effective mass m* indicating the movement of electrons.

Thus, while the nitride film has improved dielectric characteristics, a remarkably reduced leak current and improved device characteristics, the film forming process can be easily performed by the apparatus and method of this example to form the nitride film on a Si substrate or the like, can be easily carried out under atmospheric pressure at a lower temperature in comparison with the conventional art, and can be easily arranged in an in-line manner. Thus, the film forming process can be easily carried out on the basis of the existing method and apparatus.

The nitride film manufactured by this nitriding film formation method and apparatus has improved device characteristics including the leak current characteristic, different from those of the conventional nitride film, or having characteristic values closer to the theoretical values, not achievable in the case of the conventional nitride film. Therefore, novel use of the nitride film can be expected.

Figure 24B:
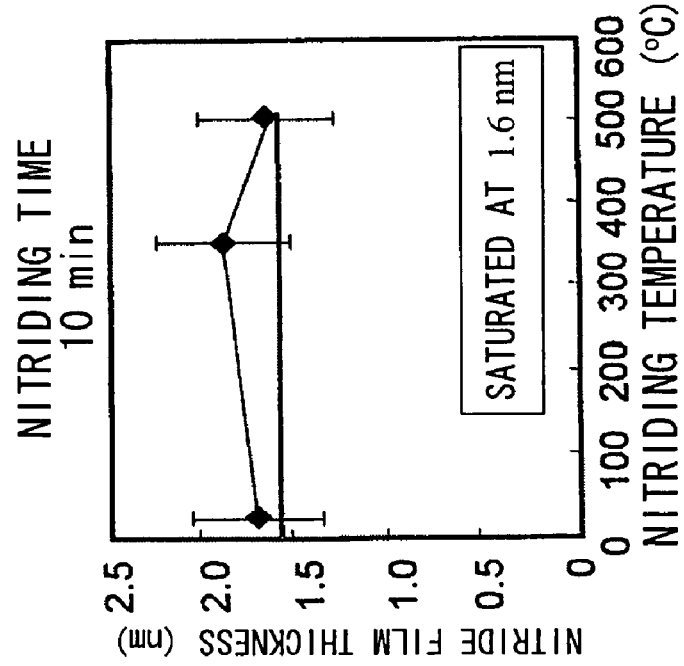
FIG. 24 is a diagram showing kinetics of Silicon nitridation in film forming by the apparatus and method of this example.
Figure 24A:
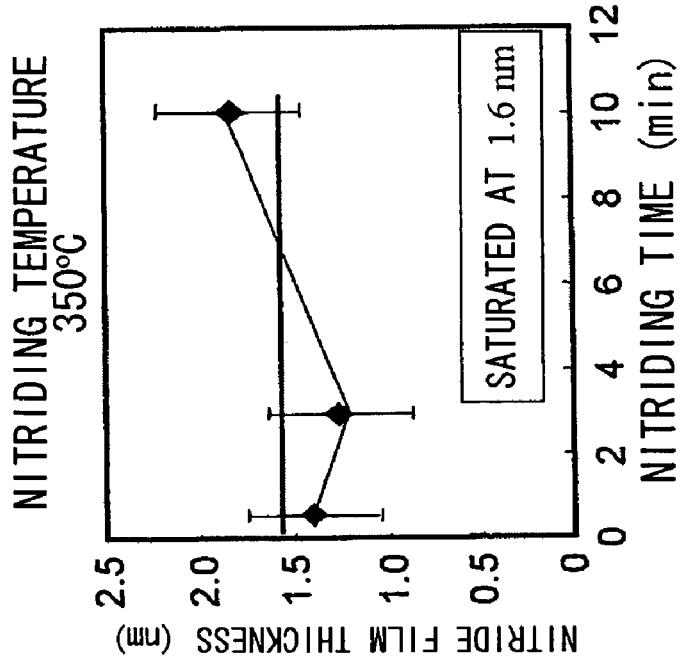

FIG. 24 is a diagram showing kinetics of Silicon nitridation in film forming by the apparatus and method of this example. FIG. 24($a$) shows a nitriding temperature (° C.) dependence of the nitride film thickness (nm), and FIG. 24($b$) shows a nitriding time (min.) dependence of the nitride film thickness (nm).

As shown in FIG. 24($a$), observation was performed under a condition: a nitriding time of 10 min. by setting three nitriding temperature points 25° C., 300° C. and 500° C. The results show that the nitride film thickness was saturated at 1 to 2 nm at each observation temperature. It was thereby confirmed that nitriding reaction had substantially no dependence on the nitriding temperature.

Also, as shown in FIG. 24($b$), observation was performed under a condition: a nitriding temperature of 350° C. by setting three nitriding times 0.5 min., 3 min. and 10 min. The results show that the nitride film thickness was saturated at about 1 to 2 nm in each observation time. It was thereby confirmed that nitriding reaction had substantially no dependence on the nitriding time.

Figure 25:
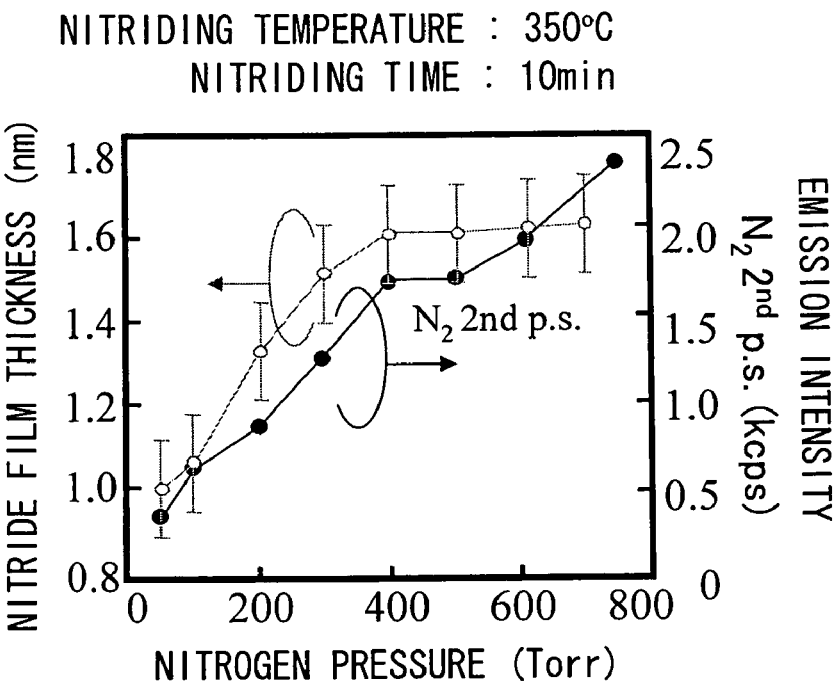
FIG. 25 is a diagram showing thickness-pressure characteristics of a nitride film, and emission intensity-pressure characteristics of the neutral active species $N_2$ ($2^{nd}$ p.s.) in a case where the pressure of nitrogen gas was changed.
Figure 26:
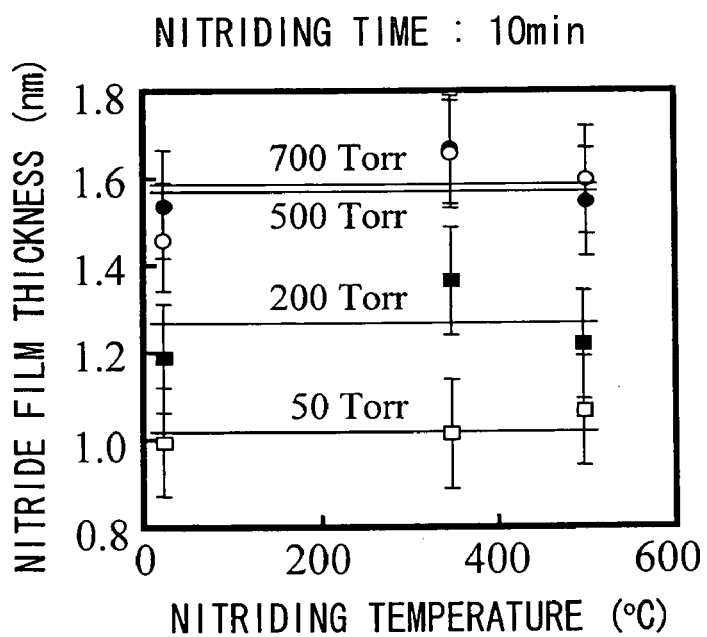
FIG. 26 is a diagram showing the film thickness-nitriding temperature characteristics of nitride film when the pressure of nitrogen gas was changed.

Description will then be made of the possibility of control of the film thickness in forming a nitride film and of electrical characteristics (insulating property) of the nitride film with reference to FIGS. 25 and 26 by considering which of the neutral active species $N_2$ ($2^{nd}$ p.s.) and $N_2$ (H.I.R.) contributes to forming of the nitride film.

FIG. 25 is a diagram showing thickness-pressure characteristics of a nitride film, and emission intensity-pressure characteristics of the neutral active species $N_2$ ($2^{nd}$ p.s.) in a case where the pressure of nitrogen gas was changed in the range from 50 to 700 Torr while the nitriding temperature was 350° C. and the nitriding time 10 min. In this case, the composition of the formed nitride film computed by structural evaluation (X-ray photoelectric spectroscopy) was $Si_3N_{3.5}O_{0.7}$.

As shown in FIG. 25, the film thickness of the nitride film is as represented by a constant value 1.6 nm in the pressure range from 400 to 700 Torr and decreases with the reduction in pressure in the pressure range from 50 to 400 Torr. The change in film thickness of the nitride film with respect to this pressure coincides with the change in emission intensity observed by optical emission spectrometry of the neutral active species $N_2$ ($2^{nd}$ p.s.) in the emission intensity-pressure characteristics of the neutral active species $N_2$ ($2^{nd}$ p.s.). It was thereby found that the neutral active species $N_2$ ($2^{nd}$ p.s.) is conducive to nitriding reaction at a nearly atmospheric pressure.

FIG. 26 is a diagram showing the film thickness-nitriding temperature characteristics of the nitride film when the pressure of the nitrogen gas was changed.

It was found that, as shown in FIG. 26 and also in FIG. 24 referred to above, the film thickness of the nitride film to be formed has no dependence on the nitriding temperature with respect to the same magnitude of nitrogen gas pressure, and the nitride film is formed by the same reaction mechanism.

As a result, it was found that the film thickness of the nitride film to be formed can be controlled with intention by controlling the amount of generation of the neutral active species $N_2$ ($2^{nd}$ p.s.) through the magnitude of pressure of nitrogen gas.

Also, in electrical characteristics (insulating property) of the nitride film, capacitance-voltage characteristics (C-V characteristics) are generally uniform in spite of different nitriding temperatures (RT), 350° C. and 500° C., as also described above with respect to the nitride film with reference to FIG. 20. Applied voltage-leak current characteristics (I-V characteristics) are also uniform in spite of different nitriding temperatures, as also described above with respect to the nitride film with reference to FIG. 21. It can therefore be understood that the electrical characteristics are not dependent on the nitriding temperature.

Consequently, also in relation to the fact that, as described above with reference to FIG. 24, nitriding reaction is not substantially dependent on the nitriding temperature, the electrical characteristics (insulating property) of the nitride film to be formed can be controlled with intention by controlling the amount of generation of the neutral active species $N_2$ ($2^{nd}$ p.s.) through the magnitude of pressure of nitrogen gas.

Figure 27:
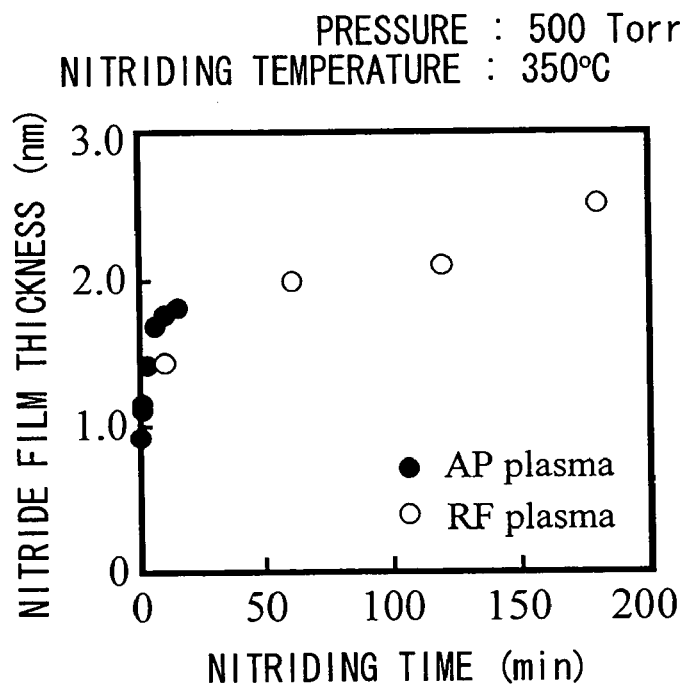
FIG. 27 is a diagram showing, through comparison between an atmospheric pressure plasma method and a RF plasma method, the relationship between the nitriding time and the thickness of nitride film to be formed.
Figure 28:
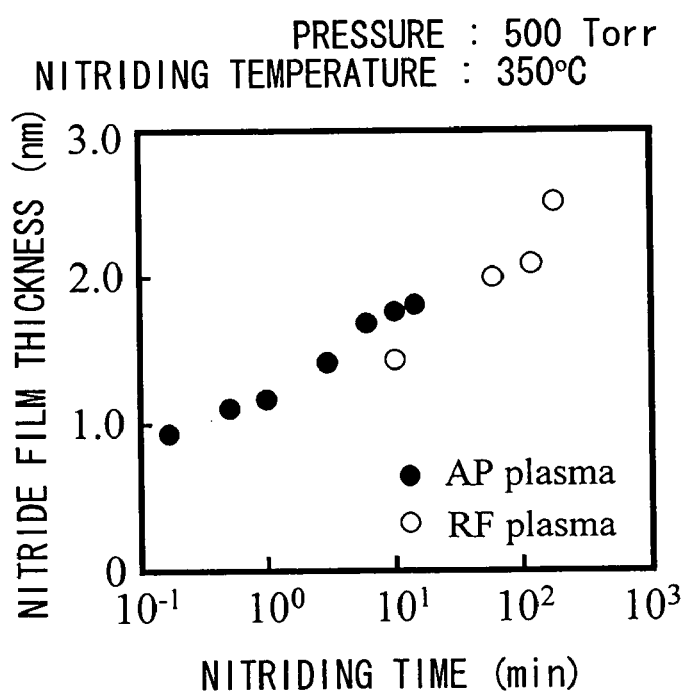
FIG. 28 is a diagram depicted by changing a scale of FIG. 27.

FIGS. 27 and 28 are diagrams showing, through comparison between the atmospheric pressure plasma method (AP plasma) based on a pulse plasma method and the RF plasma method (RF plasma), the relationship between the nitriding time and the thickness of the nitride film to be formed in a case where the nitride film is formed at a pressure of 500 Torr and a nitriding temperature of 350° C. as in the above-described case. FIGS. 27 and 28 respectively use linear and logarithmic scales for nitriding time on the abscissa but show the same data.

Referring to FIGS. 27 and 28, the film thickness in a film thickness range of about 1 nm can be controlled with respect to nitriding time through a change in nitriding time in either of the atmospheric pressure plasma method and the RF plasma method. The rate of change in film thickness dependent on the nitriding time in the atmospheric pressure plasma method is high in comparison with the rate of change in film thickness dependent on the nitriding time in the RF plasma method, but it is within a time range from 0.1 to 10 min. Therefore the control according to the atmospheric pressure plasma method can be easily performed. Also, the film thickness change region dependent on the nitriding time in the atmospheric pressure plasma method is smaller in film thickness than the film thickness change region dependent on the nitriding time in the RF plasma method.

Therefore, as shown in FIGS. 27 and 28, the atmospheric pressure plasma method ensures that a thinner nitride film can be formed in a shorter time in comparison with the RF plasma method while the nitrogen gas pressure and nitriding temperature are fixed.

Consequently, the film thickness of the nitride film to be formed can also be controlled with intention by controlling the amount of generation of the neutral active species $N_2$ ($2^{nd}$ p.s.) through control of the nitriding time while constantly maintaining the magnitude of pressure of nitrogen gas.

Figure 29:
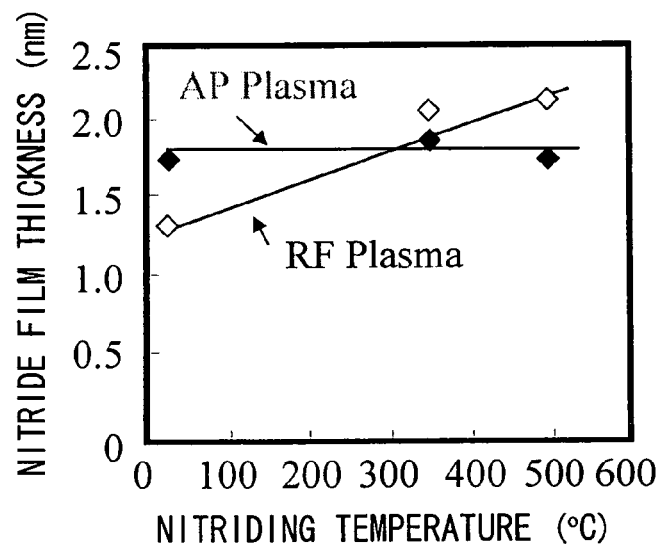
FIG. 29 is a diagram showing the relationship between the thickness of nitride film and the substrate temperature through comparison between an atmospheric pressure plasma method and a RF plasma method.

FIG. 29 shows a comparison of the relation between the film thickness and the substrate temperature in the nitride film of the atmospheric pressure plasma method (AP plasma) with that of the RF plasma method (RF plasma).

FIG. 29 shows the film thickness of nitride films formed by the atmospheric pressure plasma method under film forming conditions: a pressure of 500 Torr and a nitriding time of 10 min. as those in the above-described case while changing the temperature of the substrate (nitriding temperature) in the range from RT to 500° C., and also shows the film thickness of nitride films formed by the RF method under film forming conditions: a pressure of $1 \times 10^{-5}$ Torr and a nitriding time of 60 min. while changing the temperature of the substrate (nitriding temperature) in the range from RT to 500° C.

The film thickness of the nitride films formed by the atmospheric pressure plasma method can be made constant regardless of the nitriding temperature, while the film thickness of the nitride films formed by the RF method varies in a range of about 1 nm depending on the change in nitriding temperature.

Thus, when the nitride film is formed by the atmospheric pressure plasma method, it can be formed so that its film thickness is constant irrespective of the substrate temperature (nitriding temperature).

As described above, when the thickness of film to be formed is controlled, the atmospheric pressure plasma method of this example controls the amount of generation of the neutral active species $N_2$ ($2^{nd}$ p.s.) through control of the magnitude of the pressure of nitrogen gas and ensures that the desired film thickness, i.e., the electrical characteristics (insulating property) of the nitride film to be formed, can be controlled only by controlling the nitriding time.

Figure 30:
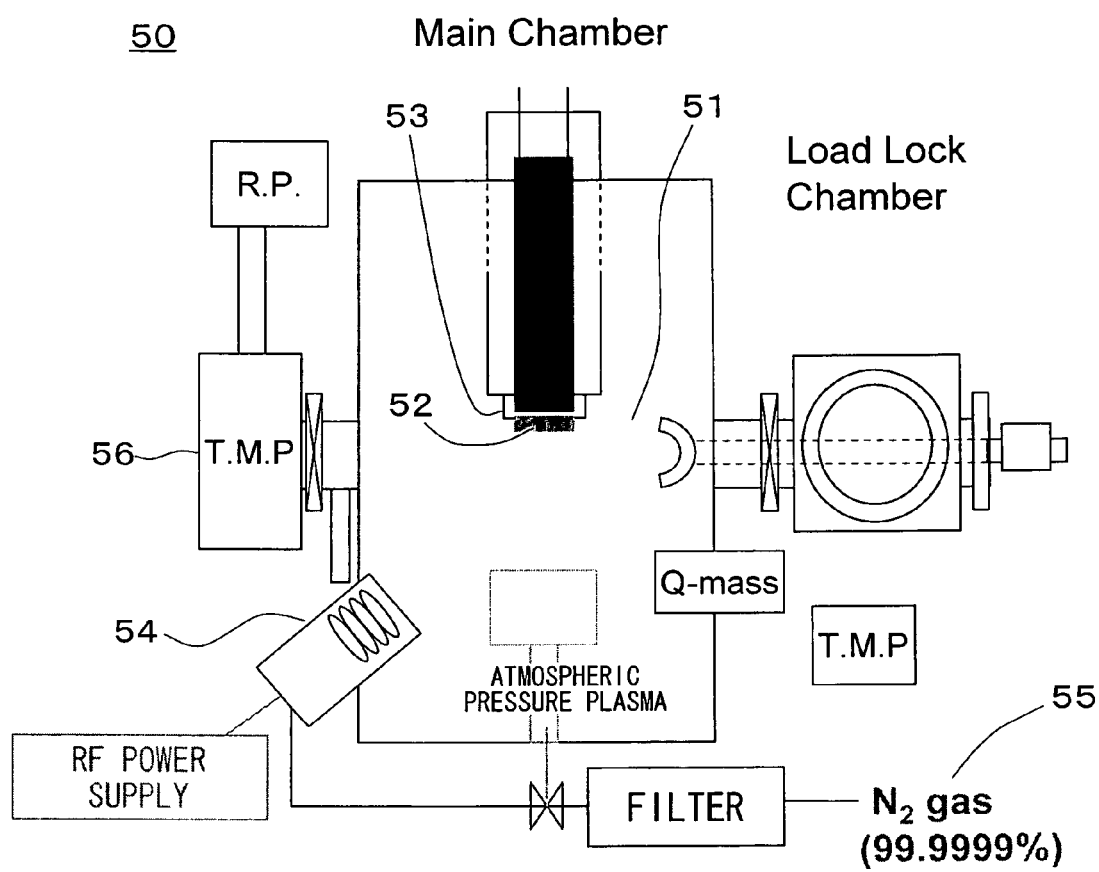
FIG. 30 is a diagram showing the construction of a RF plasma nitride film forming apparatus.

Forming of oxynitride film and nitride film according to the RF plasma method described above in comparison with the present invention was performed by using an apparatus such as shown in FIG. 30.

Referring to FIG. 30, an RF plasma nitride film forming apparatus 50 has a stage 53 on which a substrate 52 provided as an object to be processed is placed, and a radical gun 54 to which RF frequency waves are applied to change an introduced gas into radicals. The stage 53 and the radical gun 54 are provided in a reaction chamber 51. A gas supply source (nitrogen gas) 55 is connected to the radical gun 54. A pump (e.g., a turbomolecular pump; TMP) 56 for maintaining the reaction chamber at a low pressure is connected to the reaction chamber 51.

FIG. 31 shows a comparison table in a case where nitride film is formed on a substrate (p-type (111) Si) provided as an object to be processed in a predetermined temperature range from room temperature to 500° C. by each of the RF plasma nitride film forming apparatus 50 constructed as described above and the above-described nitride film forming apparatus of the present invention.

Thus, the nitride film forming apparatus of the present invention can form nitride film under a nearly atmospheric pressure in a shorter processing time (nitriding time) in comparison with the RF plasma nitride film forming apparatus 50.

The features of the nitride film formed by the apparatus and method of this example are summarized below.

As shown by structural evaluation (XPS), nitride film $Si_3N_{3.5}O_{0.7}$ was formed by supplying a high-purity nitrogen gas through a high-purity gas filter such that the oxide source ($H_2O$, $O_2$) was set to 1 ppb or less. It was confirmed that bonding of Si—N formed was uniformly distributed in the depth direction of the nitride film.

As expressed by kinetics of Silicon nitridation, nitriding reaction is not dependent on the nitriding time/nitriding temperature and nitriding is saturated and completed when a nitride film thickness of 1 to 2 nm is reached, thus enabling low-temperature high-speed nitriding.

A large reduction in nitriding time leads to an improvement of time efficiency of the process.

A complete 1.6 nm nitride film can be formed, and forming is stopped when a nitride film thickness of 1.6 nm is reached. Therefore, the invention may be combined with a CVD filming forming process to extend the possibility of novel quantum devices and materials.

For example, since the nitriding process can be strictly controlled, doping of an oxide such as a high-dielectric insulating material for MOS transistors (e.g., $ZrO_2$, $HfO_2$) with a small amount of nitrogen N can be made possible, as shown in the left block in FIG. 2. Also, forming of a nitride semiconductor film (e.g., GaN, InN, AlN) can be performed by using nitrogen plasma of the present invention together with a film forming gas containing Ga, In, or Al, as shown in the right block in FIG. 2.

EXAMPLE 2

[Conditions for Mixing of Nitrogengas and Oxide]

Description will next be made of conditions for mixing of the nitrogen gas and an oxide in relation to the amount of addition of $O_2$ mixed in the nitrogen gas introduced into the space between the electrodes (the rate of flow of $O_2$ contained in nitrogen gas to be introduced and supplied from the gas supply unit 24) in the method and apparatus for forming oxynitride film and nitride film according to the present invention.

Figure 32:
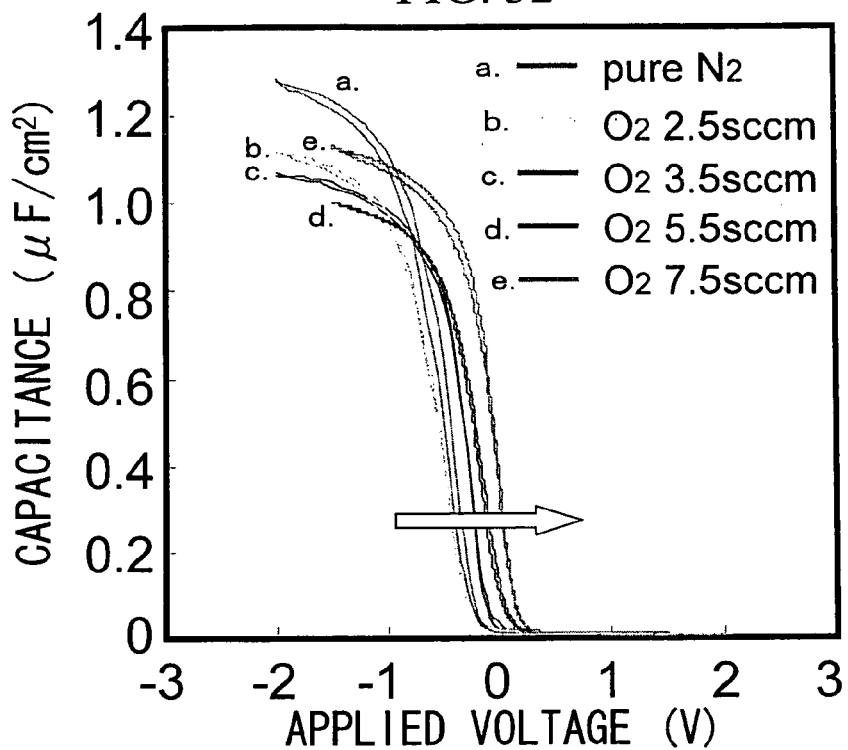
FIG. 32 is a diagram showing dielectric characteristics of oxynitride films formed according to the amount of addition of $O_2$ mixed in nitrogen gas introduced into the space between the electrode plates.

FIG. 32 is a diagram showing dielectric characteristics of oxynitride films formed according to the amount of addition of mixed $O_2$ while the rate of flow of nitrogen gas introduced into the space between the electrodes is fixed at 10 slm. The amount of exhaust was adjusted so that the pressure was 500 Torr.

As shown by C—V characteristic measurements in FIG. 32, as oxygen gas is added to the nitrogen gas in conformity with a C—V characteristic curve a. for the high-purity $N_2$ gas, the expansion of hysteresis curves in characteristic curves is reduced with the increase in addition rate, as shown in C—V characteristic curves b. to e.

Figure 33:
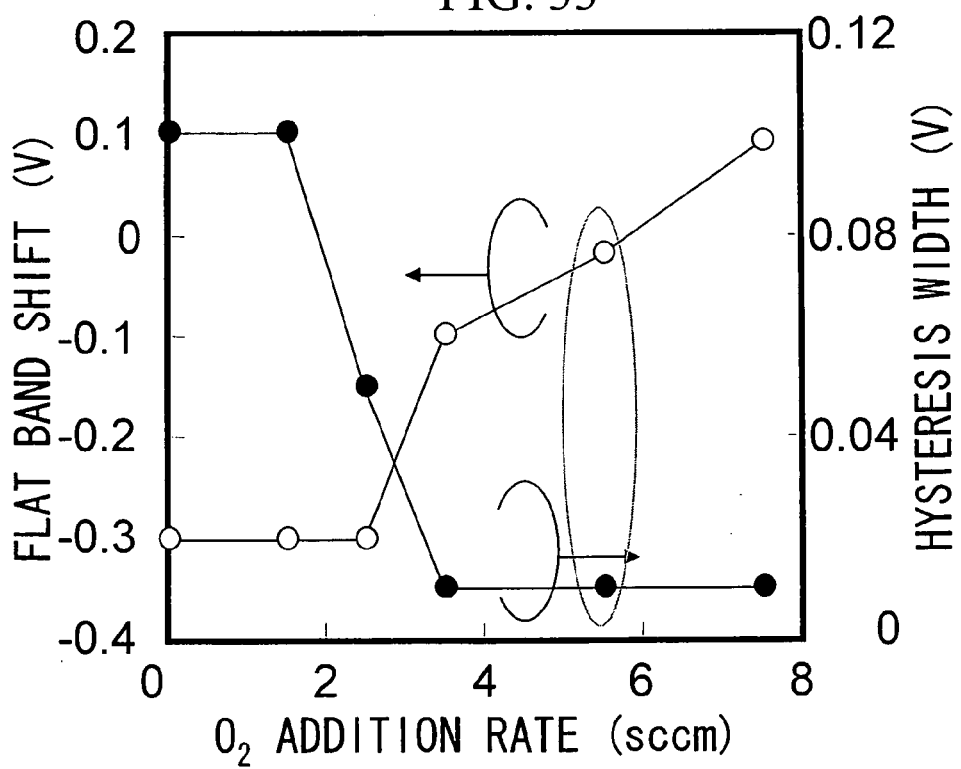
FIG. 33 is a diagram showing the relationship between the rate of addition of oxygen gas to nitrogen gas and a flat band shift of hysteresis characteristics in C—V characteristic curves, and the correlation between the rate of addition of oxygen gas to nitrogen gas and the hysteresis width of the hysteresis characteristics.

FIG. 33 is a diagram showing the relationship between the rate of addition of oxygen gas to nitrogen gas and a flat band shift (flat band voltage shift) of the hysteresis characteristics in the C—V characteristic curves shown in FIG. 32, and the correlation between the rate of addition of oxygen gas to nitrogen gas and the hysteresis width of the hysteresis characteristics shown in FIG. 32.

As shown in FIG. 33, the flat band shift of the hysteresis characteristics in the C—V characteristic curves is one-sidedly saturated on the applied voltage negative side in a region where the oxygen addition rate is 0 to 2 sccm such that substantially no oxygen gas is added to nitrogen gas, and the flat band shift of the hysteresis characteristics in the C—V characteristic curves starts changing (shifting) to the applied voltage positive side when the oxygen addition rate exceeds 2 sccm.

It was found that the hysteresis width of the C—V characteristic curves is saturated in an increased state in a region where the oxygen addition rate is 0 to 2 sccm such that substantially no oxygen gas is added to nitrogen gas; the hysteresis width of the C—V characteristic curves decreases in a region where the oxygen addition rate is 2 to 3.5 sccm; and the hysteresis width is saturated in a reduced state in a region where the oxygen addition rate is higher than 3.5 sccm.

Thus, when the oxygen addition rate is increased, the expansion of the hysteresis curves in the C—V characteristic curves is reduced. This is preferable. Conversely, change (shift) of the flat band shift of the hysteresis characteristics in the C—V characteristic curves progresses as the oxygen addition rate is increased, thereby increasing the shift of its value with respect to the applied voltage positive side.

It was found that, from consideration of the C—V characteristics of the formed oxynitride film, the state in the case of adding oxygen gas at 5.5 sccm to nitrogen gas, in which the hysteresis width of the hysteresis characteristics is reduced and the flat band shift is not positively or negatively one-sided, is preferable, and that, if precedence is given to improving the C—V characteristics of the oxynitride film, addition of oxygen gas even at a low rate is preferable.

Figure 34:
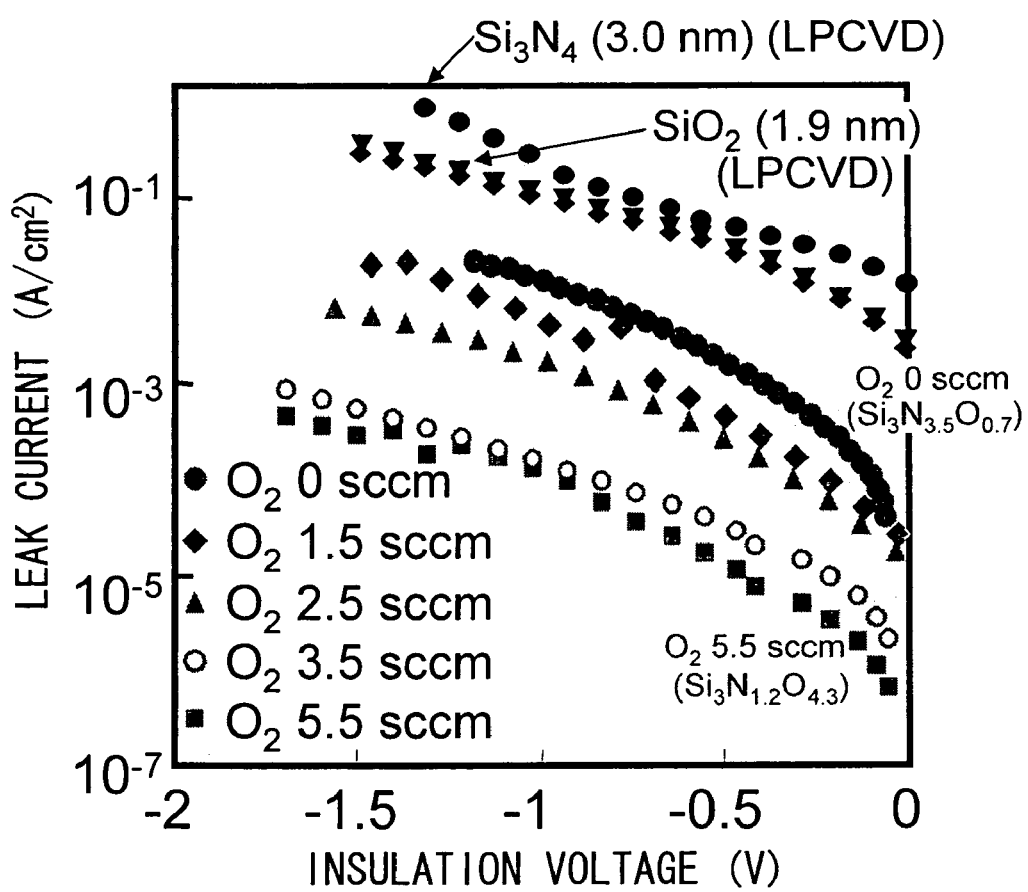
FIG. 34 is a diagram showing the relationship between the insulation voltage (dielectric voltage) and the leak current depending on the rate of addition of $O_2$ mixed in nitrogen gas introduced into the space between the electrode plates.

FIG. 34 is a diagram showing the relationship between the insulation voltage (dielectric voltage) and the leak current depending on the rate of addition of $O_2$ mixed in nitrogen gas introduced into the space between the electrode plates.

FIG. 34 shows that the leak current is reduced as the rate of addition of oxygen gas to nitrogen gas is increased, but it was found that an undesirable condition results from addition exceeding a certain rate, although the fact is not shown in the figure.

The composition of the oxynitride film obtained when the $O_2$ addition rate was 5.5 sccm was determined as $Si_3N_{1.2}O_{4.3}$ by computation from XPS.

Thus, it was found that if limiting the leak current is considered, high-purity nitrogen gas is not always preferable.

Addition of oxygen gas to nitrogen gas introduced into the space between the electrode plates will be further described by considering the relationship with the above-described leak current.

Figure 35:
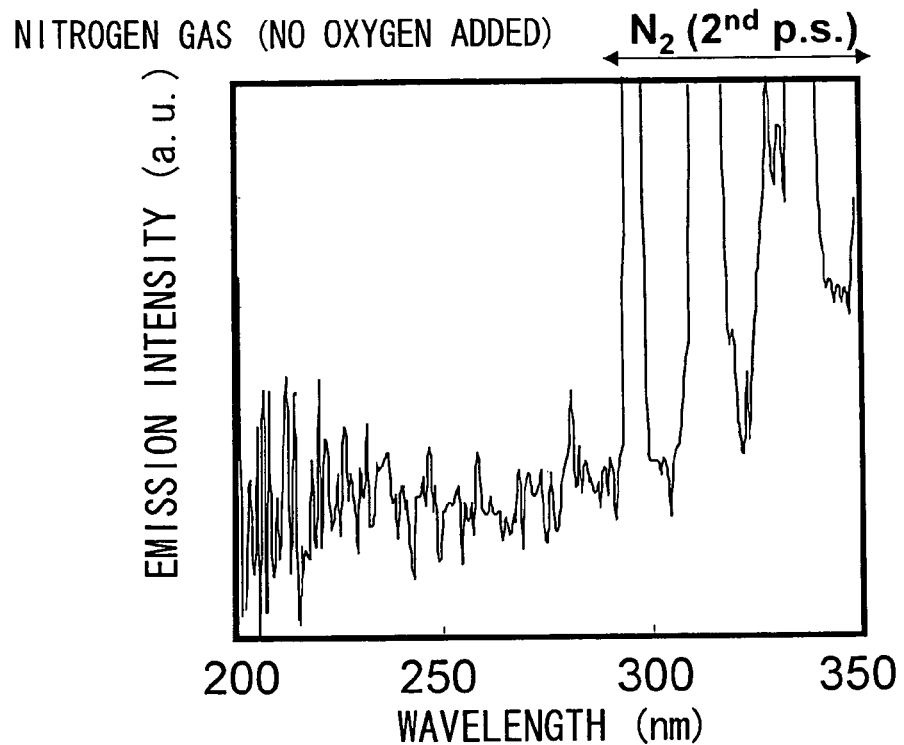
FIG. 35 is a diagram showing the results of spectral analysis on emission from nitrogen plasma observed by the direct plasma technique when no oxygen gas was added to nitrogen gas introduced.

FIG. 35 is a diagram showing the results of spectral analysis on emission from nitrogen plasma observed by the direct plasma technique when no oxygen gas was added to nitrogen gas introduced.

Figure 36:
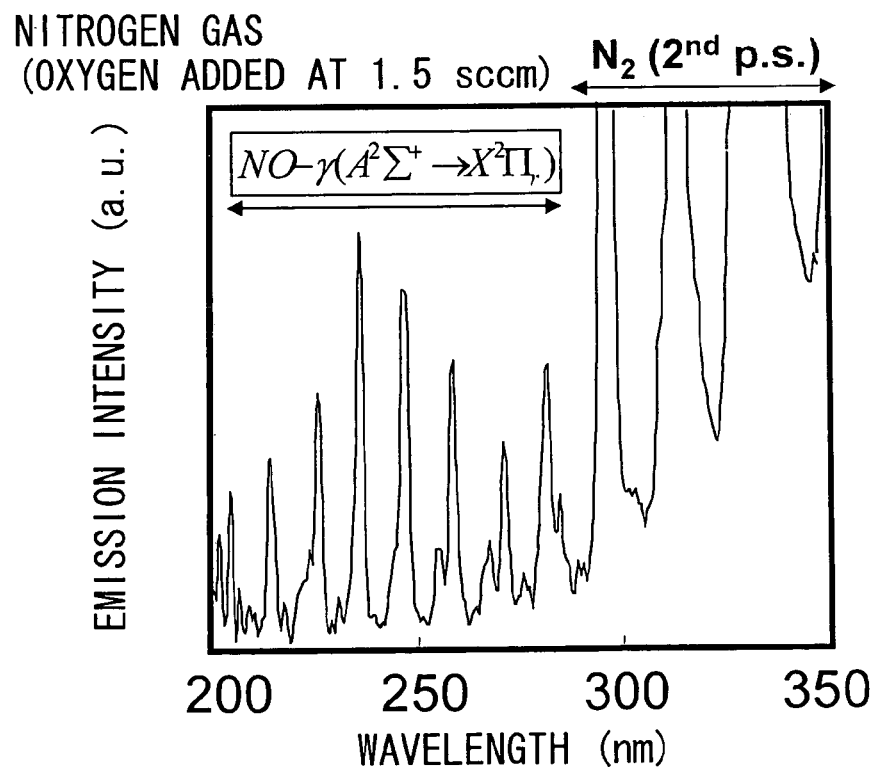
FIG. 36 is a diagram showing the results of spectral analysis on emission from nitrogen plasma observed by the direct plasma technique when oxygen gas was added to nitrogen gas introduced.

FIG. 36 is a diagram showing the results of spectral analysis on emission from nitrogen plasma observed by the direct plasma technique when oxygen gas was added at 1.5 sccm to nitrogen gas introduced.

In each of FIGS. 35 and 36, the ordinate represents the emission intensity (a.u.) and the abscissa represents the wavelength (nm), and a 200-350 (nm) wavelength region in the vicinity of a wavelength of 300 to 400 nm at which $N_2$ ($2^{nd}$ p.s.) was dominant in the observation results.

Referring to FIG. 35, in the case where no oxygen was mixed in nitrogen gas, nitrogen gas $N_2$ ($2^{nd}$ p.s.) in plasma form was dominant in a wavelength 300-350 (nm) region in the observation results. Referring to FIG. 36, in the case where oxygen gas was mixed at 1.5 sccm to nitrogen gas, nitrogen gas $N_2$ ($2^{nd}$ p.s.) in plasma form was dominant in a wavelength 300-350 (nm) region in the observation results, as in the case shown in FIG. 35, where no oxygen is mixed in nitrogen gas. In the case where oxygen gas was mixed at 1.5 sccm to nitrogen gas, occurrence of emission derived from NO-γ, not recognized in the case where no oxygen gas was mixed in nitrogen gas, was confirmed in a wavelength 200-300 nm region.

From this, it was found that determination as to whether or not oxygen gas is mixed in nitrogen gas introduced into the space between the electrode plates can be made by checking the state of occurrence of NO-γ.

Observation by the direct plasma technique was then performed with respect to changes in rate of addition of oxygen gas to nitrogen gas.

Figure 37:
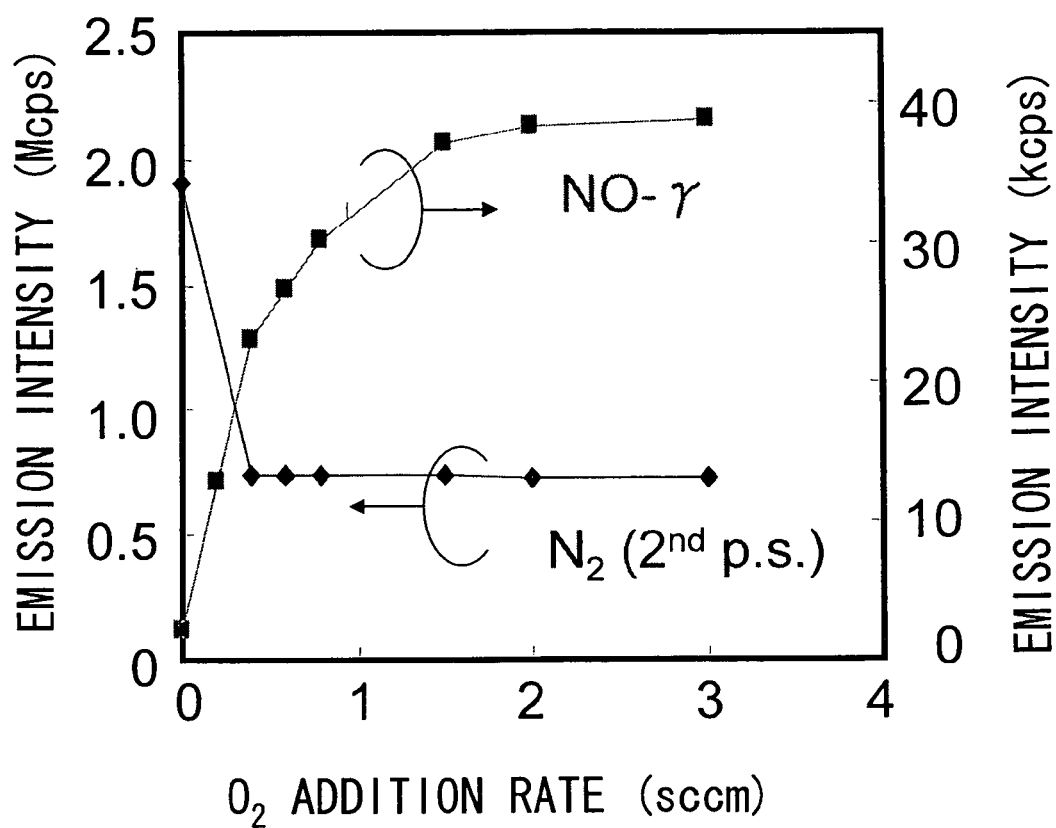
FIG. 37 is a diagram showing the relationship between the oxygen gas addition rate and the emission intensity from $N_2$ ($2^{nd}$ p.s.) and the relationship between the oxygen gas addition rate and the emission intensity from NO-γ on the basis of the results of spectral analysis on emission from nitrogen plasma with respect to the changes in rate of addition of oxygen gas.

FIG. 37 is a diagram showing the relationship between the oxygen gas addition rate and the emission intensity from $N_2$ ($2^{nd}$ p.s.) and the relationship between the oxygen gas addition rate and the emission intensity from NO-γ on the basis of the results of spectral analysis on emission from nitrogen plasma with respect to the changes in rate of addition of oxygen gas. In FIG. 37, the ordinate represents the intensity of emission (Mcps) from $N_2$ ($2^{nd}$ p.s.) and the intensity of emission (kcps) from NO-γ, and abscissa represents the rate of addition (sccm) of oxygen gas.

It was found that, in this case, the intensity of emission (Mcps) from $N_2$ ($2^{nd}$ p.s.), which was 2.0 Mcps when no oxygen gas was mixed, decreased after a start of mixing (addition) of oxygen gas, was saturated at a certain value (0.7 Mcps in this case) after addition of oxygen gas at 0.5 sccm, and did not changed therefrom even when the oxygen gas addition rate was increased from 0.5 sccm until the maximum value 3 sccm in the case shown in the figure was reached. On the other hand, it was found that almost no emission was detected from NO-γ when no oxygen gas was mixed, and the intensity of emission (kcps) from NO-γ increased after a start of mixing (addition) of oxygen gas, was saturated at a certain value (2.2 kcps in this case) after addition of oxygen gas at the maximum addition rate 3.0 sccm in the case shown in the figure, and did not changed from this value even when the oxygen gas addition rate was increased.

It was thereby found that each of the intensity of emission from $N_2$ ($2^{nd}$ p.s.) and the intensity of emission from NO-γ was independent of the rate of addition of oxygen gas after the corresponding predetermined addition rate was exceeded.

A structural evaluation (XPS) was then made of films formed by changing the rate of addition of oxygen gas to nitrogen gas while setting fixed film forming conditions: a Si substrate nitriding temperature of 350° C. and a nitriding time of 10 min.

Figure 38:
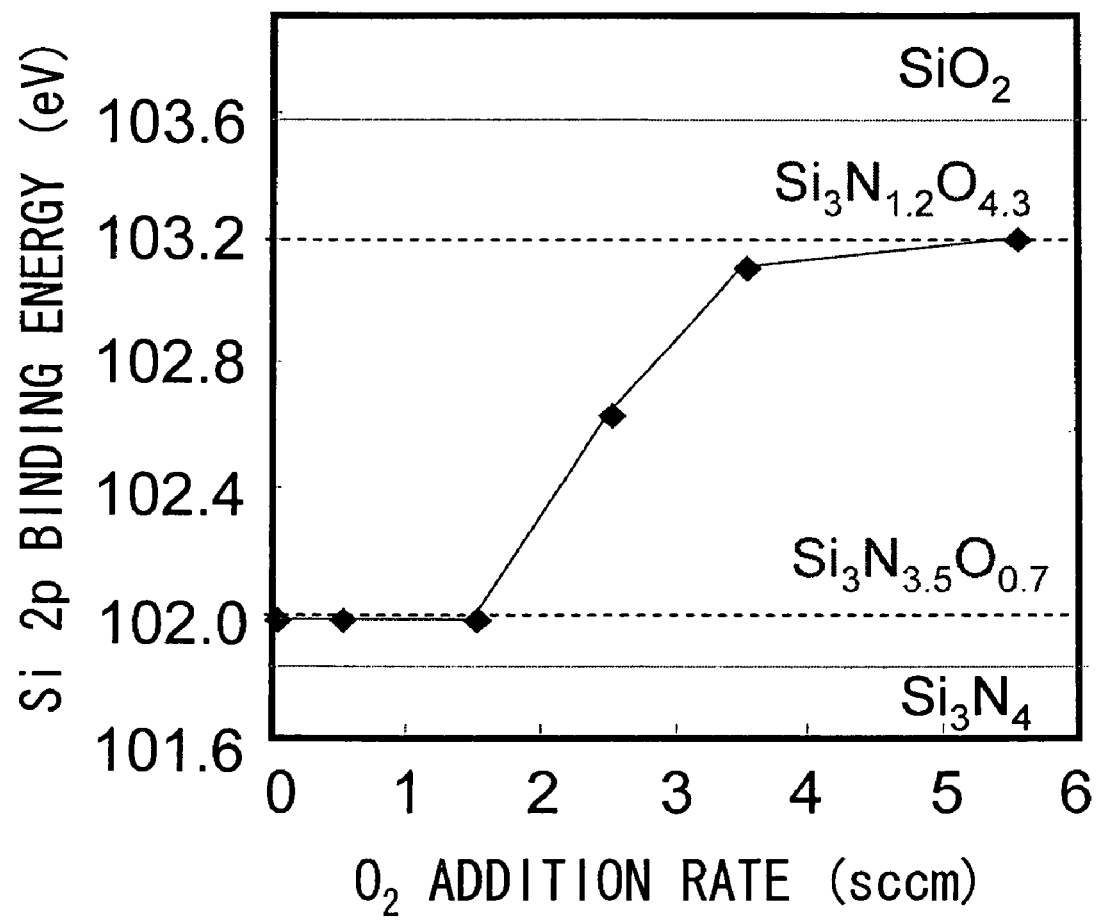
FIG. 38 is a diagram showing the relationship between the rate of addition of oxygen gas and Si2p binding energy with respect to films formed by changing the rate of addition of oxygen gas to nitrogen gas.

FIG. 38 is a diagram showing the relationship between the rate of addition of oxygen gas and Si2p binding energy with respect to films formed by changing the rate of addition of oxygen gas to nitrogen gas.

It was found that in this case the Si2p binding energy of the formed film was constant at 102.0 eV when the rate of addition of oxygen gas was within the range from 0 to 1.5 sccm, started increasing when the rate of addition of oxygen exceeded 1.5 sccm, and the binding energy started saturating in the vicinity of 103.2 ev about a time when the rate of addition of oxygen exceeded 3.5 sccm.

The value of the Si2p binding energy will be examined. The Si2p binding energy 102.0 eV associated with the rate of addition of oxygen gas 0 to 1.5 sccm corresponds to the binding energy of the nitride film $Si_3N_{3.5}O_{0.7}$, and the Si2p binding energy 102.0 eV associated with the rate of addition of oxygen gas 5.5 sccm after the beginning of saturation of the Si2p binding energy corresponds to the binding energy of the oxynitride film $Si_3N_{1.2}O_{4.3}$.

From these, it was found that when the proportion of oxygen in the oxynitride film becomes higher (increases), the tendency of NO-γ emission to increase and saturate and the change of the proportion of oxygen (the rate of addition of oxygen gas) to increase and saturate coincide with each other, and that an effect equivalent to controlling the rate of addition of oxygen gas mixed in nitrogen gas in forming a nitride film and an oxynitride film can therefore be obtained by performing nitriding on the basis of the intensity of emission from NO-γ under the plasma condition under which emission from NO-γ is observed.

Therefore, even in a case where nitrogen gas has an extremely low content of an oxide as an impurity, or a case where there is a need to consider contamination from an oxide contained in the solid dielectric provided on the electrodes, the rate of addition of oxygen can be correctly controlled on the basis of the intensity of emission from NO-γ.

According to the nitride film formation method and the oxynitride formation method of the present invention, the nitriding process can be strictly controlled. Therefore, for example, as shown in the left block in FIG. 2 referred to above, an oxide (e.g., $ZrO_2$, $HfO_2$) comprising a high-dielectric-constant insulating material for MOS transistors is doped with an extremely small amount of nitrogen N. If nitrogen plasma of the present invention is used in film forming of $ZrO_2$ or $HfO_2$, nitrogen is contained in a film, that is, a film doped with nitrogen is formed. Nitrogen is also contained in a film in a case where a thin oxide film is formed and the process of performing plasma processing on the surface of the film is repeated. In the former case, a surface portion of the film is doped with nitrogen. In the latter case, even an inner portion of the film is doped with nitrogen. This process can be performed as a CVD film forming process.

INDUSTRIAL APPLICABILITY

The present invention can be put to wide use as nitride film and oxynitride film. For example, the present invention is applied to semiconductor surface control using nitride film or oxynitride film, MOS transistors using nitrogen doping, nitride semiconductors, light emitting elements, optical deices, and communication devices.

The invention claimed is:

1. A method for forming an oxynitride film, characterized by comprising providing a solid dielectric on at least one of opposed surfaces of a pair of electrodes opposed to each other under nearly atmospheric pressure, introducing a nitrogen gas containing oxygen or an oxide at higher than 1 ppm and equal to or lower than 0.2% into a space between the pair of opposed electrodes, applying an electric field to the nitrogen gas, and bringing the resulting plasma, in which an $N_2$ (H.I.R.) and/or $N_2$ ($2^{nd}$ p.s.) active species appears dominantly as active nitrogen species observed by optical emission spectroscopy, into contact with an object to be processed to form an oxynitride film on a surface of the object to be processed.

2. The method for forming an oxynitride film according to claim 1, characterized in that the nearly atmospheric pressure is equal to or higher than 300 Torr.

3. The method for forming an oxynitride film according to claim 1, characterized in that the gas atmosphere under nearly atmospheric pressure in which the plasma is obtained is a gas atmosphere in which emission of light derived from NO-γ is observed by optical emission spectroscopy.

4. The method for forming an oxynitride film according to claim 2, characterized in that the nearly atmospheric pressure is 500 to 800 Torr.

5. The method for forming an oxynitride film according to claim 1, characterized in that the $N_2$ ($2^{nd}$ p.s.) and/or $N_2$ (H.I.R.) active species is a neutral active species present in the plasma as active nitrogen species observed by optical emission spectroscopy.

6. The method for forming an oxynitride film according to claim 1, characterized in that the plasma is brought into contact with the object to be processed in a diffusion region outside the discharge space between the opposed electrodes.

7. The method for forming an oxynitride film according to claim 1, characterized in that the solid dielectric is a dielectric containing substantially no oxide.

8. The method for forming an oxynitride film according to claim 1, characterized in that the object to be processed has a surface temperature of 50° C. or higher, more preferably 100° C. or higher.

9. An oxynitride film formed on a surface of an object to be processed by applying an electric field to a nitrogen gas containing oxygen or an oxide at higher than 1 ppm and equal to or lower than 0.2%, and bringing the object to be processed into contact with the resulting plasma in which an $N_2$ (H.I.R.) and/or $N_2$ ($2^{nd}$ p.s.) active species appears dominantly.

10. A substrate having on its surface an oxynitride film formed by applying an electric field to a nitrogen gas containing oxygen or an oxide at higher than 1 ppm and equal to or lower than 0.2%, and bringing an object to be processed into contact with the resulting plasma in which an $N_2$ (H.I.R.) and/or $N_2$ ($2^{nd}$ p.s.) active species appears dominantly.

11. A method for forming an oxynitride film on a surface of an object to be processed, which comprises providing a plasma chamber having at least two gas inlets and a gas outlet and a pair of opposing electrodes arranged within said chamber including a solid dielectric present on at least one of the opposed electrode surfaces, introducing a nitrogen gas under nearly atmospheric pressure containing oxygen or an oxide in an amount higher than 1 ppm and equal to or lower than 0.2% into a space between the pair of opposed electrodes, at the same time introducing a second gas containing no oxygen or containing oxygen in an amount of 1 ppb or less into the chamber around the opposed electrodes, applying an electric field to the nitrogen gas introduced into the space between the opposed electrodes to generate a plasma, and contacting the object to be processed with the resulting plasma to form an oxynitride film on a surface of the object to be processed.

12. The method for forming an oxynitride film according to claim 11, wherein the nitrogen gas introduced into the space between the pair of opposed electrodes contains oxygen or an oxide in an amount of 50 ppm or higher and equal to or lower than 0.2%.

* * * * *